(12) United States Patent
Jung et al.

(10) Patent No.: US 10,298,045 B2
(45) Date of Patent: May 21, 2019

(54) ELECTRONIC DEVICE FOR CHECKING BATTERY ABNORMALITY AND CONTROL METHOD THEREOF

(71) Applicant: Samsung Electronics Co., Ltd., Gyeonggi-do (KR)

(72) Inventors: Hoon Jung, Gyeongsangbuk-do (KR); Joo Hoan Do, Gyeonggi-do (KR); Min Woo Song, Gyeongsangbuk-do (KR); Sung Won Moon, Daegu (KR); Hyun Seok Lee, Daegu (KR); Eui Chan Jung, Gyeongsangbuk-do (KR); Moo Young Kim, Seoul (KR); Hyo Seok Na, Gyeonggi-do (KR); Ji Woo Lee, Gyeongsanbuk-do (KR)

(73) Assignee: Samsung Electronics Co., Ltd (KR)

( * ) Notice: Subject to any disclaimer, the term of this patent is extended or adjusted under 35 U.S.C. 154(b) by 126 days.

(21) Appl. No.: 15/643,171

(22) Filed: Jul. 6, 2017

(65) Prior Publication Data

US 2018/0254640 A1   Sep. 6, 2018

(30) Foreign Application Priority Data

Mar. 6, 2017   (KR) ........................ 10-2017-0028505

(51) Int. Cl.
*H02J 7/00* (2006.01)
*G01R 31/36* (2019.01)
(52) U.S. Cl.
CPC .......... *H02J 7/007* (2013.01); *G01R 31/3606* (2013.01); *H02J 7/0045* (2013.01)

(58) Field of Classification Search
USPC ................................ 320/128, 132, 134, 136
See application file for complete search history.

(56) References Cited

U.S. PATENT DOCUMENTS

2007/0001646 A1\* 1/2007 Kojima ................. H02J 7/0011
320/128
2008/0054723 A1  3/2008 Noh et al.
(Continued)

FOREIGN PATENT DOCUMENTS

KR    1020080020867    3/2008
KR    1020160105167    9/2016

*Primary Examiner* — Brian Ngo
(74) *Attorney, Agent, or Firm* — The Farrell Law Firm, P.C.

(57) ABSTRACT

A method of controlling an electronic device is provided which includes electrically connecting a battery with an external power source using a first switch such that a first portion of a first current supplied from the external power source is supplied to a system circuit of the electronic device and a second portion of the first current is supplied to the battery, determining whether a specified condition is satisfied, electrically disconnecting the battery from the external power source using the first switch and electrically connecting the battery with a resistor using a second switch, if the specified condition is satisfied, verifying an electrical characteristic of a current applied to the resistor while the battery is electrically disconnected from the external power source and is electrically connected with the resistor, and determining whether an operation of the battery is abnormal, based at least on a part of the electrical characteristic.

20 Claims, 13 Drawing Sheets

(56) References Cited

U.S. PATENT DOCUMENTS

| | | | |
|---|---|---|---|
| 2010/0063757 A1* | 3/2010 | Suzuki | H02J 7/00 |
| | | | 702/63 |
| 2013/0141828 A1* | 6/2013 | Yamaguchi | H01M 10/44 |
| | | | 361/86 |
| 2014/0239988 A1* | 8/2014 | Soma | G01R 31/31715 |
| | | | 324/750.3 |
| 2015/0280493 A1* | 10/2015 | Cha | H02J 7/0029 |
| | | | 307/64 |
| 2016/0254688 A1 | 9/2016 | Jung et al. | |
| 2017/0018819 A1* | 1/2017 | Toya | H01M 10/0525 |

\* cited by examiner

ELECTRONIC DEVICE FOR CHECKING BATTERY ABNORMALITY AND CONTROL METHOD THEREOF

PRIORITY

This application claims priority under 35 U.S.C. § 119(a) to Korean Patent Application Serial No. 10-2017-0028505, which was filed on Mar. 6, 2017, in the Korean Intellectual Property Office, the entire disclosure of which is incorporated herein by reference.

BACKGROUND

1. Field of the Disclosure

The present disclosure generally relates to an electronic device, and more particularly, to an electronic device that determines whether a battery is abnormal, and a method of controlling the electronic device.

2. Description of the Related Art

An electronic device may include a battery and may be powered by the battery.

After a battery is fully charged, an electronic device may measure a leakage current of the battery while self-discharging the battery that is in a no-load state.

When an electronic device tests a self-discharge characteristic of the battery after the battery is fully charged, the electronic device measures a leakage current of the battery. For this reason, it may take a lot of time (e.g., several hours) to measure the leakage current of the battery.

SUMMARY

Aspects of the present disclosure are to address at least the above-mentioned problems and/or disadvantages and to provide at least the advantages described below. Accordingly, an aspect of the present disclosure is to provide an electronic device which is capable of testing whether an operation of a battery is abnormal and a method of controlling the electronic device.

In accordance with an aspect of the present disclosure, an electronic device is provided which includes a power interface that receives a first current from an external power source, a battery capable of being charged using the first current, a system circuit that operates using the first current or a second current supplied from the battery, a resistor capable of being selectively connected to the battery, a first switch that electrically connects or disconnects the battery to or from the external power source, a second switch that electrically connects or disconnects the battery to or from the resistor, and a power management circuit that controls an operation of the first switch and the second switch. The power management circuit is configured to electrically connect the battery with the external power source using the first switch such that a first portion of the first current supplied from the external power source is supplied to the system circuit and a second portion of the first current is supplied to the battery, to electrically disconnect, if a specified condition is satisfied, the battery from the external power source using the first switch and electrically connect the battery with the resistor using the second switch, to verify an electrical characteristic of a current applied to the resistor while the battery is electrically disconnected from the external power source and is electrically connected with the resistor, and to determine whether an operation of the battery is abnormal, based at least on a part of the electrical characteristic.

In accordance with another aspect of the present disclosure, a method of controlling an electronic device is provided which includes electrically connecting a battery with an external power source using a first switch such that a first portion of a first current supplied from the external power source is supplied to a system circuit of the electronic device and a second portion of the first current is supplied to the battery, determining whether a specified condition is satisfied, electrically disconnecting the battery from the external power source using the first switch and electrically connecting the battery with a resistor using a second switch, if the specified condition is satisfied, verifying an electrical characteristic of a current applied to the resistor while the battery is electrically disconnected from the external power source and is electrically connected with the resistor, and determining whether an operation of the battery is abnormal, based at least on a part of the electrical characteristic.

In accordance with another aspect of the present disclosure, a non-transitory computer-readable recording medium has recorded thereon a program, which when executed, performs a method of controlling an electronic device. The method includes electrically connecting a battery with an external power source using a first switch such that a first portion of a first current supplied from the external power source is supplied to a system circuit of the electronic device and a second portion of the first current is supplied to the battery, electrically disconnecting the battery from the external power source using the first switch and electrically connecting the battery with a resistor using a second switch, if a specified condition is satisfied, verifying an electrical characteristic of a current applied to the resistor while the battery is electrically disconnected from the external power source and is electrically connected with the resistor, and determining whether an operation of the battery is abnormal, based at least on a part of the electrical characteristic.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
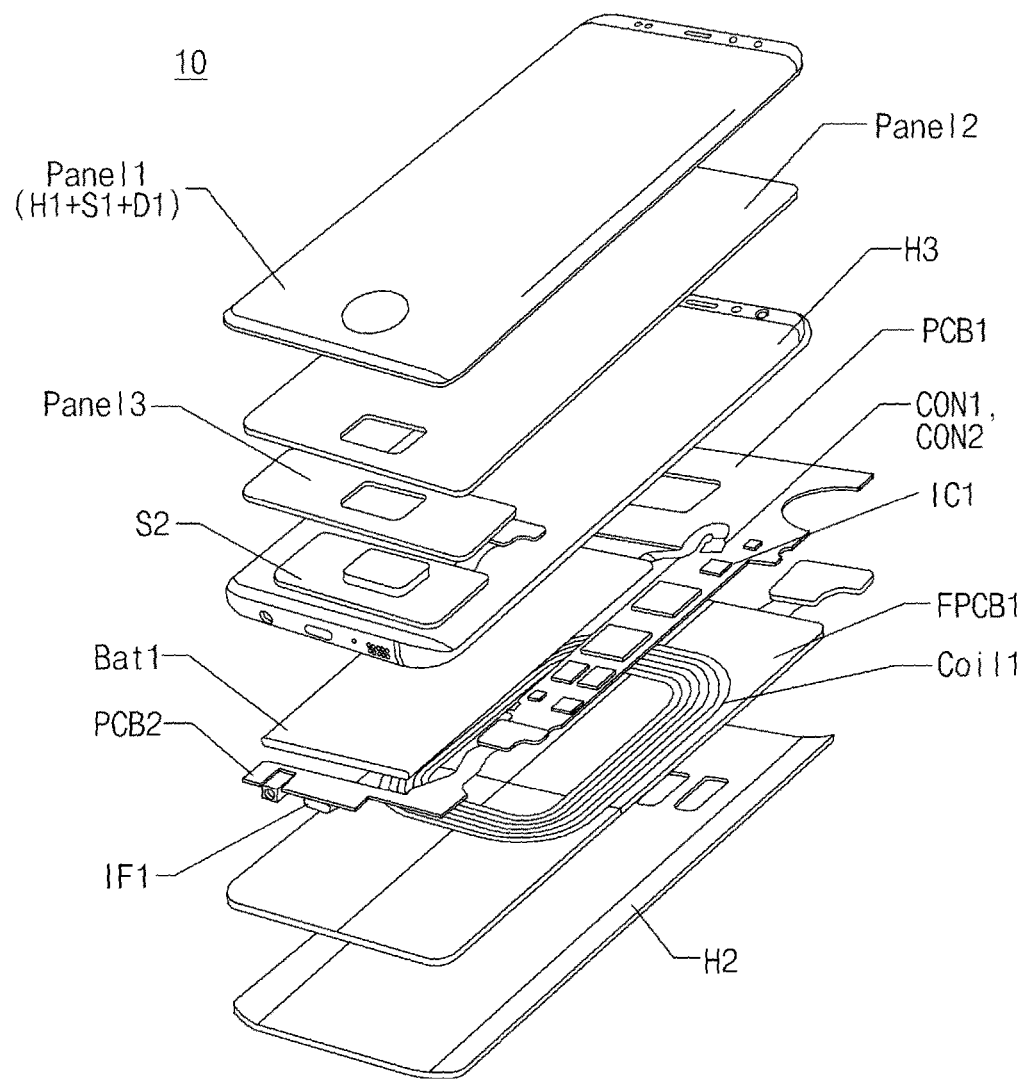
FIG. 1 is an exploded perspective view of an electronic device, according to an embodiment of the present disclosure.

Hereinafter, certain embodiments of the present disclosure may be described with reference to accompanying drawings. Accordingly, those of ordinary skill in the art will recognize that modifications, equivalents, and/or alternatives on the various embodiments described herein may be made without departing from the scope and spirit of the present disclosure. With regard to the description of drawings, similar elements may be marked by similar reference numerals.

In the present disclosure, the expressions "have", "may have", "include" and "comprise", or "may include" and "may comprise" as used herein indicate the existence of corresponding features (e.g., elements such as numeric values, functions, operations, or components) but do not exclude the presence of additional features.

In the present disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

Terms, such as "first", "second", and the like used in the present disclosure may be used to refer to various elements regardless of the order and/or the priority and to distinguish the relevant elements from other elements, but do not limit the elements. For example, "a first user device" and "a second user device" indicate different user devices regardless of the order or priority. For example, without departing the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening elements (e.g., a third element).

According to the situation, the expression "configured to" as used in the present disclosure may be used as, for example, the expression "suitable for", "having the capacity to", "designed to", "adapted to", "made to", or "capable of". The term "configured to" does not mean only "specifically designed to" in hardware. Instead, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a general-purpose processor (e.g., a central processing unit (CPU) or an application processor) which performs corresponding operations by executing one or more software programs which are stored in a memory device.

Terms used in the present disclosure are used to describe specified embodiments and do not limit the scope of the present disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the present disclosure. In some cases, even if terms are defined in the present disclosure, they are not to be interpreted to exclude embodiments of the present disclosure.

An electronic device according to an embodiment of the present disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, mobile medical devices, cameras, or wearable devices. The wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit).

According to an embodiment of the present disclosure, the electronic device may be a home appliance. The home appliances may include at least one of, for example, televisions (TVs), digital versatile disc (DVD) players, audio players, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to an embodiment of the present disclosure, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, global navigation satellite system (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller machines (ATMs), point of sales (POS) terminals, or Internet of things (IoT) devices (e.g., light bulbs, various sensors, electric or gas meters, sprinkler devices, fire alarms, thermostats, street lamps, toasters, exercise equipment, hot water tanks, heaters, boilers, and the like).

According to an embodiment of the present disclosure, the electronic device may include at least one of parts of furniture or buildings/structures, electronic boards, electronic signature receiving devices, projectors, or various measuring instruments (e.g., water meters, electricity meters, gas meters, or wave meters, and the like). The electronic device may be one of the above-described devices or a combination thereof. An electronic device may be a flexible electronic device. Furthermore, an electronic device may not be limited to the above-described electronic devices and may include other electronic devices and new electronic devices according to the development of new technologies.

Hereinafter, electronic devices according to an embodiment of the present disclosure, will be described with reference to the accompanying drawings. In the present disclosure, the term "user" may refer to a person who uses an electronic device or may refer to a device (e.g., an artificial intelligence electronic device) that uses the electronic device.

FIG. 1 is an exploded perspective view of an electronic device, according to an embodiment of the present disclosure.

Referring to FIG. 1, according to an embodiment of the present disclosure, an electronic device 10 (e.g., an electronic device 1001 or 1101) includes housing members H1, H2, and H3, system circuits (e.g., D1, S1, S2, panel2, and panel3), a battery Bat1 (e.g., a battery 1196), printed circuit boards (PCBs) PCB1 and PCB2, wireless charging circuits FPCB1, Coil1, and IF1, and a power management unit IC1 (e.g., a power management module 1195). FIG. 1 illustrates a form in which the display panel Panel1 includes the first cover H1, the touch sensor S1, and the display D1. However, the present disclosure is not limited thereto.

According to an embodiment of the present disclosure, the housing members include the first cover H1, which constitutes a front surface of the electronic device 10, the second cover H2, which constitutes a rear surface of the electronic device 10, and the support member H3 which constitutes a side surface of the electronic device 10. The first cover H1, the support member H3, and the second cover H2 may be combined with each other to constitute each of the front surface, the side surface, and the rear surface of the electronic device 10. The housing members H1, H2, and H3 may fix or protect the PCBs PCB1 and PCB2, the system circuits (e.g., D1, S1, S2, panel2, and panel3), the battery Bat1, the power management unit (e.g., IC1), the wireless charging circuits FPCB1, Coil1, and IF1, and the like.

According to an embodiment of the present disclosure, at least a part of the first cover H1 may be formed of a transparent material and may expose the display D1, which is disposed to be connected or combined with an inner surface of the first cover H1, to the outside. The support member H3 may fix and protect the battery Bat1. For example, the support member H3 may include a diaphragm structure for dividing the battery Bat1 and the PCBs PCB1 and PCB2. The support member H3 may isolate a region for the battery Bat1 through the diaphragm structure.

According to an embodiment of the present disclosure, the system circuits (e.g., D1, S1, S2, panel2, and panel3) may include elements that need a power supply in the electronic device 10. For example, the system circuits (e.g., D1, S1, S2, panel2, and panel3) may include the display D1 (e.g., a display 1060 or 1160), the touch sensor S1 (e.g., a touch panel 1151), an electromagnetic induction panel Panel2 (e.g., a digitizer) (e.g., a pen sensor 1154), a pressure sensor (e.g., Panel3), a fingerprint sensor S2, and a processor (e.g., U2) (e.g., a processor 1020 or 1110). The system circuits (e.g., D1, S1, S2, panel2, and panel3) other than the processor (e.g., U2) may be omitted, may be replaced with another element, and may be implemented in a form in which at least one is integrated.

For example, the display D1 may include a liquid crystal display (LCD), a light-emitting diode (LED) display, an organic LED (OLED) display, or an electronic paper display. For example, the display D1 may display various types of content (e.g., a text, an image, a video, an icon, and/or a symbol) to a user. According to an embodiment of the present disclosure, the display D1 may provide various screen ratios. For example, the display D1 may display a screen corresponding to a screen ratio (e.g., 18.5:9 (default) or 21:9) determined by the processor U2. A display area of the display D1 may be divided into a first area and a second area. For example, the first area may be an area for a soft key (e.g., a home key) interface. The pressure sensor (e.g., Panel3) may be located under the first area. As another example, the second area may be an area for executing various types of applications and displaying content. The display area of the display D1 may not be divided into a plurality of areas.

The touch sensor S1 may sense a touch of a user that is applied to the display D1. The touch sensor S1 may have a size that is the same as or similar to that of the display D1, and the touch sensor S1 may recognize touch coordinates corresponding to the display area of the display D1. The touch sensor S1 may include an RX electrode and a TX electrode and may sense the touch of the user based on the change in capacitance. For example, a touch panel of the touch sensor S1 may include the RX electrode and TX electrode in a single layer. The touch coordinates recognized through the touch sensor S1 may be used in conjunction with pressure coordinates sensed through the pressure sensor (e.g., panel3).

The electromagnetic induction panel Panel2 may be a panel for recognizing a user interface using a stylus pen.

The pressure sensor (e.g., Panel3) may sense pressure of the user that is applied to the pressure sensor panel Panel3. The pressure sensor (e.g., Panel3) may be implemented to be used in the capacitance manner. For example, the pressure sensor (e.g., Panel3) may be implemented to be used in a self-capacitance manner and a mutual capacitance manner. The panel Panel3 of the pressure sensor (e.g., Panel3) may be composed of the RX electrode layer and the TX electrode layer (i.e., dual layers). A dielectric may be disposed between the RX electrode layer and the TX electrode layer and may maintain a gap between the electrode layers. An electrode configuration of the pressure sensor (e.g., Panel3) may be implemented differently according to the capacitance manner (the self-capacitance or the mutual capacitance). The pressure sensor (e.g., Panel3) may be located under the whole area of the display D1 and may be located under a partial area of the display D1.

For example, the fingerprint sensor S2 may be an optical fingerprint sensor that senses a fingerprint of the user. For example, when the fingerprint of the user contacts with the fingerprint sensor S2, the fingerprint sensor S2 may receive the reflected light by using a light source of the display D1 and may obtain a fingerprint image by using the reflected light.

The processor U2 may perform calculation or data processing on control and/or communication of at least another of the elements of the electronic device 10. For example, the processor U2 may control the screen ratio, a driving mode, and a user interface manner of the display D1. As another example, the processor U2 may sense a user interface based on at least one of pressure information sensed through the pressure sensor (e.g., Panel3) and touch information sensed through the touch sensor S1. As another example, the processor U2 may control the power management unit (e.g., IC1). A detailed configuration in which the processor U2 controls the power management unit (e.g., IC1) will be described with reference to FIG. 2.

According to an embodiment of the present disclosure, the battery Bat1 may be embedded in the housing member H1, H2, or H3 in the pouch form (an in-cell type). A first connector CON1 may be included in both terminals of the battery Bat1. The battery Bat1 may be electrically connected with the PCBs PCB1 and PCB2 through the first connector CON1. The battery Bat1 may include a protection circuit module (PCM) circuit that prevents the battery from overcharging and overdischarging. The battery Bat1 may be fixed or protected by the diaphragm structure of the support member H3. For example, the battery Bat1 may be located at a location that is spaced apart from the PCBs PCB1 and PCB2 by a specific interval. The diaphragm structure may be disposed between the battery Bat1 and the PCBs PCB1 and PCB2.

According to an embodiment of the present disclosure, the power management unit (e.g., IC1), at least a part of the system circuits (e.g., D1, S1, S2, panel2, and panel3), and the like may be mounted in the PCBs PCB1 and PCB2. The PCBs PCB1 and PCB2 may be composed of a plurality of boards PCB1 and PCB2. For example, the power management unit (e.g., IC1) and a second connector CON2 may be mounted on the first board PCB1, and the charging interface IF1 may be mounted on the second board PCB2. The first board PCB1 and the second board PCB2 may be electrically connected with each other through a connector and the like. The charging interface IF1 may be connected with a charger (e.g., a fast charger, a wireless charger, and the like) in a wired or wireless manner. For example, the charging interface IF1 may be a micro universal serial bus (USB). As another example, the charging interface IF1 may be an interface of USB 3.X (e.g., USB 3.1 Type C) standard. The PCBs PCB1 and PCB2 may be spaced apart from the battery Bat1 by a specific interval.

According to an embodiment of the present disclosure, for example, the wireless charging circuits FPCB1, Coil1, and IF1 may be located under the PCBs PCB1 and PCB2 and may receive power from a wireless charger. The power received through the wireless charging circuits FPCB1, Coil1, and IF1 may be used to charge the battery Bat1.

According to an embodiment of the present disclosure, the power management unit (e.g., IC1) may control the charging of the battery Bat1. The power management unit (e.g., IC1) may detect whether the battery Bat1 is abnormal. Below, the power management unit (e.g., IC1) will be described in detail.

Figure 2:
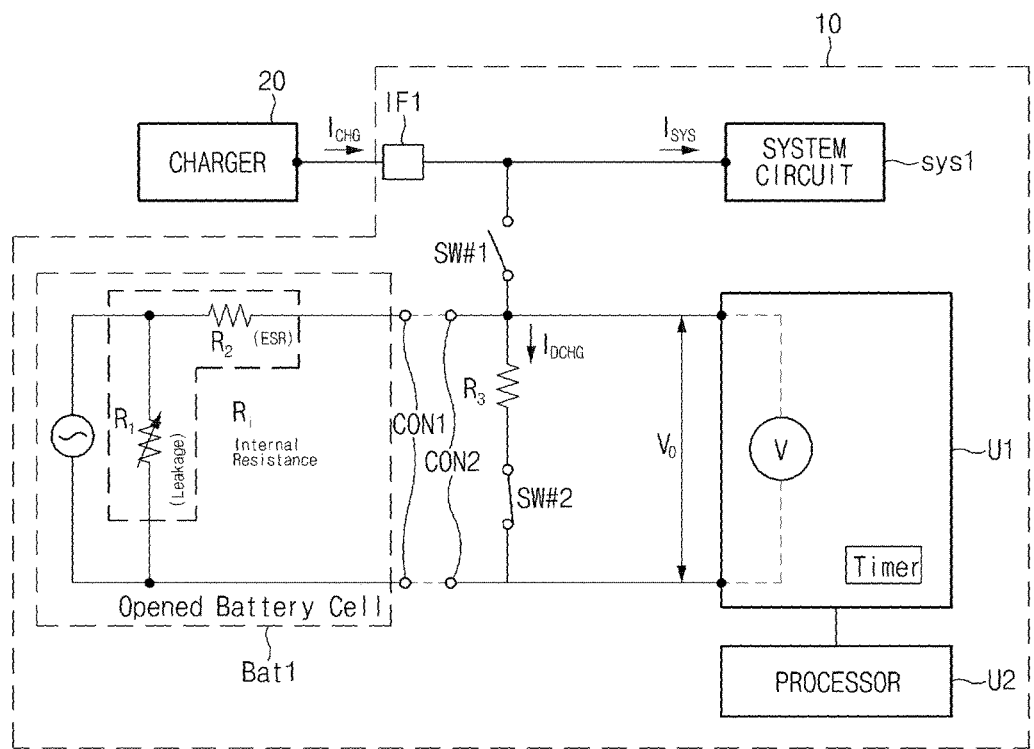
FIG. 2 is a circuit diagram schematically illustrating an electronic device, according to an embodiment of the present disclosure.

FIG. 2 is a circuit diagram schematically illustrating an electronic device, according to an embodiment of the present disclosure.

Referring to FIG. 2, the electronic device 10 includes a battery Bat1, an external resistor R3, a first switch SW#1, a second switch SW#2, a power management unit U1, and a system circuit sys1. In an embodiment, the first switch SW#1 and the second switch SW#2 may be included in the power management unit U1.

FIG. 2 illustrates the electronic device 10 together with a charger 20. The charger 20 (or an external power source) may supply a charging current I_CHG to the electronic device 10. The charger 20 may include a fast charger, a normal charger, and a data cable. The fast charger may include a fast travel charger, a fast wireless charger, a fast accessory battery, and the like. The normal charger may include a normal travel charger, a normal wireless charger, an accessory battery, and the like. The data cable may be a cable that is connected to a specified interface (e.g., USB) of a desktop PC, a laptop PC, a notebook computer, and the like.

Below, each element of the electronic device 10 will be described.

According to an embodiment of the present disclosure, as illustrated in following Table 1, the battery Bat1 may be charged with a charging current corresponding to a charging mode.

TABLE 1

| Charging mode | Charging current | Charger type |
| --- | --- | --- |
| Fast charging mode | About 1.6~3 A | Fast charger<br>Fast wireless charger<br>Fast accessory battery |
| Normal charging mode | About 1 A | Normal charger<br>Normal wireless charger<br>Accessory battery |
| USB mode | About 500 mA | A desktop PC/a laptop PC/a notebook |

According to an embodiment of the present disclosure, the battery Bat1 may include a first resistor R1 and a second resistor R2 that correspond to a battery characteristic. If the battery Bat1 is in a normal state, the first resistor R1 may have a very high resistance value (e.g., about 100 MΩ or more) as equivalent parallel resistance (or leakage resistance) of both terminals of a battery. In the case where the battery Bat1 is deteriorated, damaged by external impact, or flooded, an insulating state of the battery Bat1 may be deteriorated. If the battery insulating state is deteriorated, flow of charges (or a leakage current) may occur in the battery Bat1, and the flow of charges may cause battery heat, a battery fire, and the like. As the battery insulating state is deteriorated, a value of the first resistor R1 is changed into a relatively low resistance value. Accordingly, a resistance value of the first resistor R1 may be used to determine the battery insulating state (the leakage current). If the battery Bat1 is in a normal state, the second resistor R2 may have a very low resistance value (e.g., about 0.6Ω) as equivalent series resistance (ESR) or diffusion resistance. As the battery Bat1 is deteriorated, the resistance value of the second resistor R2 may increase.

According to an embodiment of the present disclosure, the first switch SW#1 may electrically connect or disconnect the battery Bat1 to or from the charger 20. For example, the first switch SW#1 may be included on a path between the charger 20 and the battery Bat1. When turned on, the first switch SW#1 may supply the charging current from the charger 20 to the battery Bat1. When turned off, the first switch SW#1 may not supply the charging current from the charger 20 to the battery Bat1. Unlike the above description, when turned off, the first switch SW#1 may supply the charging current from the charger 20 to the battery Bat1. When turned on, the first switch SW#1 may not supply the charging current from the charger 20 to the battery Bat1. For descriptive convenience, the former case will be described below.

In an embodiment of the present disclosure, the first switch SW#1 may be configured to stably operate at a high charging current (e.g., about 1 A). For example, the first switch SW#1 may be a power transistor (e.g., a MOSFET) that has low internal resistance.

According to an embodiment of the present disclosure, the external resistor R3 may be connected with both terminals of the battery Bat1 through the second switch SW#2. The external resistor R3 may have a resistance value (e.g., about 100Ω) that is greater than the equivalent series resistance of the normal battery Bat1 and is less than the equivalent parallel resistance thereof. The lower the resistance value of the external resistor R3, the shorter the battery test time. However, if the resistance value of the external resistor R3 is too low, the performance of the battery Bat1 may be influenced (e.g., heat is generated). As such, the resistance value of the external resistor R3 may be experimentally determined based on at least one of a battery test time and a battery characteristic.

According to an embodiment of the present disclosure, the second switch SW#2 may electrically connect or disconnect the battery Bat1 to or from the external resistor R3. For example, the second switch SW#2 may be connected in series with the external resistor R3. As another example, when turned on, the second switch SW#2 may electrically connect the battery Bat1 with the external resistor R3. When turned off, the second switch SW#2 may electrically disconnect the battery Bat1 from the external resistor R3. As another example, when turned off, the second switch SW#2 may electrically connect the battery Bat1 with the external resistor R3. When turned on, the second switch SW#2 may electrically disconnect the battery Bat1 from the external resistor R3. For descriptive convenience, the former case will be described below.

In an embodiment of the present disclosure, the second switch SW#2 may be configured to stably operate at a high discharging current (e.g., about 1 A). For example, the second switch SW#2 may be a power transistor that has low internal resistance.

According to an embodiment of the present disclosure, if the charger 20 is connected with the charging interface IF1, the power management unit U1 may supply the charging current from the charger 20 to the system circuit sys1 and the battery Bat1. For example, the power management unit U1 may supply a first portion I_SYS of the charging current I_CHG to the system circuit sys1 by using the first switch SW#1 and may supply a second portion (I_BAT=I_CHG−I_SYS) of the charging current I_CHG to the battery Bat1. As another example, if the charger 20 is connected with the charging interface IF1, the power management unit U1 may close the first switch SW#1 such that the charging current I_CHG is supplied to the system circuit sys1 and the battery Bat1. In this case, the power management unit U1 may open the second switch SW#2.

According to an embodiment of the present disclosure, in a state where the charger 20 is connected with the charging interface IF1, the power management unit U1 may determine whether the charging current satisfies a first condition, for each specified first period (e.g., 30 minutes). The first period may be set or adjusted by the power management unit U1 or the processor U2.

For example, the power management unit U1 may determine whether the first condition is satisfied, based at least on a part of the result of comparing a first amount of the charging current I_CHG, which is supplied from the charger 20 during a specified time period (e.g., 1 min) in the first period, with a second amount of the current I_SYS used by the system circuit sys1 during a specified time period. For example, the first condition may be that the charging current I_CHG covers a consumption current of the system circuit sys1, and the first condition may be that an amount of the charging current I_CHG is not less than an amount of current that allows the electronic device 10 to maintain the booting state without rebooting even though the battery Bat1 is not connected with the charger 20. As another example, the first condition may be that the charging current I_CHG is not less than a specified multiple (e.g., twice) of the consumption current I_SYS.

According to an embodiment of the present disclosure, the power management unit U1 may determine whether the first condition is satisfied, for each specified period. In this case, the power management unit U1 may use a first specified condition as at least a part of a specified condition at a first time point corresponding to the specified period and may use a second specified condition as at least a part of the specified condition at a second time point corresponding to a specified period. The consumption current I_SYS may vary according to at least one of a hardware execution status of the electronic device 10 and an execution status of an application. For example, as the number of applications being executed increases, the consumption current I_SYS may increase. As another example, as the number of hardware components increases, the consumption current I_SYS may increase. However, since the consumption currents of hardware components are different from each other, the number of hardware components and the consumption current I_SYS may not be directly proportional. As such, the power management unit U1 may measure the consumption current, which is changed according to the hardware execution status and the execution status of the application, and the charging current. The power management unit U1 may use another specified condition (e.g., first specified condition or second specified condition) for each specified period based on the result in which the measured consumption current is compared with the measured charging current.

According to an embodiment of the present disclosure, if the charging current does not satisfy the first condition in the first period, the power management unit U1 may change a charging mode into a fast charging mode. For example, if the charger 20 is connected with the charging interface IF1, the power management unit U1 may verify a charger type (e.g., a fast charger, a normal charger, a data cable, and the like). In the case where the verified charger type is a fast charger, the power management unit U1 may change the charging mode into the fast charging mode if the charging current does not satisfy the first condition. In this process, the power management unit U1 may change the charging mode into the fast charging mode even though not in a low battery state. As such, a power state of the electronic device 10 may be supported to be stably maintained in a battery test process.

According to an embodiment of the present disclosure, in the case where the charging current satisfies the first condition, the power management unit U1 may disconnect the battery Bat1 from the charger 20 and may electrically connect the battery Bat1 with the external resistor R3. For example, in the case where the charging current satisfies the first condition, the power management unit U1 may electrically disconnect the battery Bat1 from the charger 20 using the first switch SW#1 and may electrically connect the battery Bat1 with the external resistor R3 using the second switch SW#2. As another example, the power management unit U1 may electrically disconnect the battery Bat1 from the charger 20 by opening the first switch SW#1, the power management unit U1 may electrically connect the battery Bat1 with the external resistor R3 by closing the second switch SW#2. In this case, both terminals of the battery Bat1 are connected with the external resistor R3, and thus, the battery current may be discharged through the external resistor R3.

In an embodiment of the present disclosure, the power management unit U1 may disconnect the battery Bat1 from the charger 20 by using the first switch SW#1. After a first time period, the power management unit U1 may connect the battery Bat1 with the external resistor R3 using the second switch SW#2. The first time period may be experimentally determined based on a diffusion characteristic of the battery Bat1. Since the battery Bat1 is most heavily diffused within several seconds from a point in time when the battery Bat1 is disconnected from the charger 20, a battery voltage is suddenly dropped, and then the battery voltage drops relatively slowly. Accordingly, for example, the first time period may be set to several seconds corresponding to a time period in which the battery voltage is suddenly dropped.

According to an embodiment of the present disclosure, in a state where the battery Bat1 is electrically disconnected from the charger 20 and is electrically connected with the external resistor R3, the power management unit U1 may verify an electrical characteristic of a current applied to the external resistor R3. For example, the power management unit U1 may measure a voltage between both terminals of the external resistor R3.

According to an embodiment of the present disclosure, the power management unit U1 may verify a battery discharging characteristic (e.g., a battery discharging time) based at least on the electrical characteristic of a current applied to the external resistor R3. The power management unit U1 may determine whether the battery is abnormal, based on the verified battery discharging characteristic. For example, the power management unit U1 may measure a time, which is required to discharge the battery Bat1 by the specified variation (e.g., about 0.01 V), based on a point in time when the battery Bat1 is connected with the external resistor R3. The specified variation may be experimentally determined based on the diffusion characteristic of the battery Bat1. If the measured time is less than a critical time, the power management unit U1 may determine that the battery Bat1 is abnormal. The critical time may be experimentally determined based on a time that is required to discharge a normal battery by the specified variation. Since an abnormal battery is rapidly discharged due to a leakage current in the battery Bat1, a time (the measured time) required for the specified variation discharging may be less than a time (the critical time) that is required to discharge the normal battery by the specified variation. As such, whether the battery is abnormal may be determined by using a battery discharging characteristic.

According to an embodiment of the present disclosure, by using a battery discharging characteristic, if the power management unit U1 determines that the battery is abnormal, based on the test result of the battery discharging characteristic, the power management unit U1 may restrict the charging of the battery Bat1.

According to an embodiment of the present disclosure, by using a battery discharging characteristic, if the power management unit U1 determines that the battery is normal, based on the result of testing the battery discharging characteristic, the power management unit U1 may restore states of the first switch SW#1 and the second switch SW#2 to previous states. For example, if the measured time is not less than the critical time, the power management unit U1 may open the second switch SW#2 and may close the first switch SW#1. A point in time, when the second switch SW#2 is opened and the first switch SW#1 is closed, and an open/close order of the first and second switches SW#1 and SW#2 may be experimentally determined based on the power stability of the electronic device 10.

In an embodiment of the present disclosure, in the case where the charger 20 is disconnected from the charging interface IF1 while the power management unit U1 tests the battery discharging characteristic, the power management unit U1 may close the first switch SW#1 and may open the second switch SW#2, such that the battery current is supplied to the electronic device 10.

According to an embodiment of the present disclosure, the system circuit sys1 may include elements that need a power supply in the electronic device 10. For example, the system circuit sys1 may include a processor circuit of a high current, which needs digital power. As another example, the system circuit sys1 may include all circuits, which need power, for example, the display D1, various types of sensors (e.g., a pressure sensor, a touch sensor, and a fingerprint sensor), the processor U2, and the like. The system circuit sys1 other than the processor U2 may be omitted, may be replaced with another element, and may be implemented in the form in which at least one is integrated.

For example, the processor U2 may include at least one of a central processing unit (CPU), a graphic processing unit (GPU), a microprocessor, an application processor, an application specific integrated circuit (ASIC), or field programmable gate arrays (FPGA). The processor U2 may have a plurality of cores and may include a memory.

According to an embodiment of the present disclosure, the processor U2 may take the place of at least a part of functions of the power management unit U1 or may additionally perform at least a part of the functions of the power management unit U1. The processor U2 may control the first and second switches SW#1 and SW#2 on behalf of the power management unit U1. In this case, the first and second switches SW#1 and SW#2 may not be included in the power management unit U1. The processor U2 may control the power management unit U1 in a battery charging process. The processor U2 may adjust a battery test frequency (a first period) of the power management unit U1 based on a usage status (alternatively, usage frequency or an event) of the electronic device 10. For example, the processor U2 may relatively increase battery test frequency in the on-state of the display D1 and may relatively decrease the battery test frequency in the off-state of the display D1. As another example, the processor U2 may relatively increase the battery test frequency during the daytime when the usage frequency of the electronic device 10 is relatively high, the processor U2 may relatively decrease the battery test frequency during the nighttime when the usage frequency of the electronic device 10 is relatively low. As another example, the processor U2 may relatively increase the battery test frequency in the active state of the electronic device 10 and may relatively decrease the battery test frequency in the sleep state thereof. As another example, if a wearable device (e.g., a smart watch) is located within a communication range of the electronic device 10, the processor U2 may relatively increase the battery test frequency. If the wearable device is located out of the communication range of the electronic device 10, the processor U2 may relatively decrease the battery test frequency. As such, as the battery test is performed in the case where the usage frequency of the electronic device 10 is relatively low, the battery test may be performed to have a relatively little influence on the usability of the electronic device 10.

In an embodiment of the present disclosure, the processor U2 may notify the power management unit U1 of usage status information (or usage frequency information) of the electronic device 10. The usage status information may be information for providing notification of at least one of a sleep state of the electronic device 10, day time zone, night time zone, display on/off, whether to communicate with a wearable device, and the like. In this case, the power management unit U1 may adjust the first period based on the usage status information of the electronic device 10.

Compared with the case in which the user does not use the electronic device 10, the first period in which the battery is tested may be increased in the case in which the user uses the electronic device 10. Accordingly, the battery may be tested such that the user is less interrupted when the user uses the electronic device 10.

According to an embodiment of the present disclosure, if the processor U2 determines that the battery is abnormal, through the power management unit U1, the processor U2 may notify the user that the battery is abnormal. For example, in the case where the power management unit U1 determines that the battery is abnormal, the processor U2 may display a text for providing notification that the battery is abnormal, in the display D1. The processor U2 may display a text for providing notification of restricting of battery charging, in the display D1.

In an embodiment of the present disclosure, since testing the battery regardless of whether the battery is fully charged and reducing a time required for the battery test (e.g., from 1 hour to several minutes), the processor U2 may rapidly detect that the battery is abnormal.

Figure 3A:
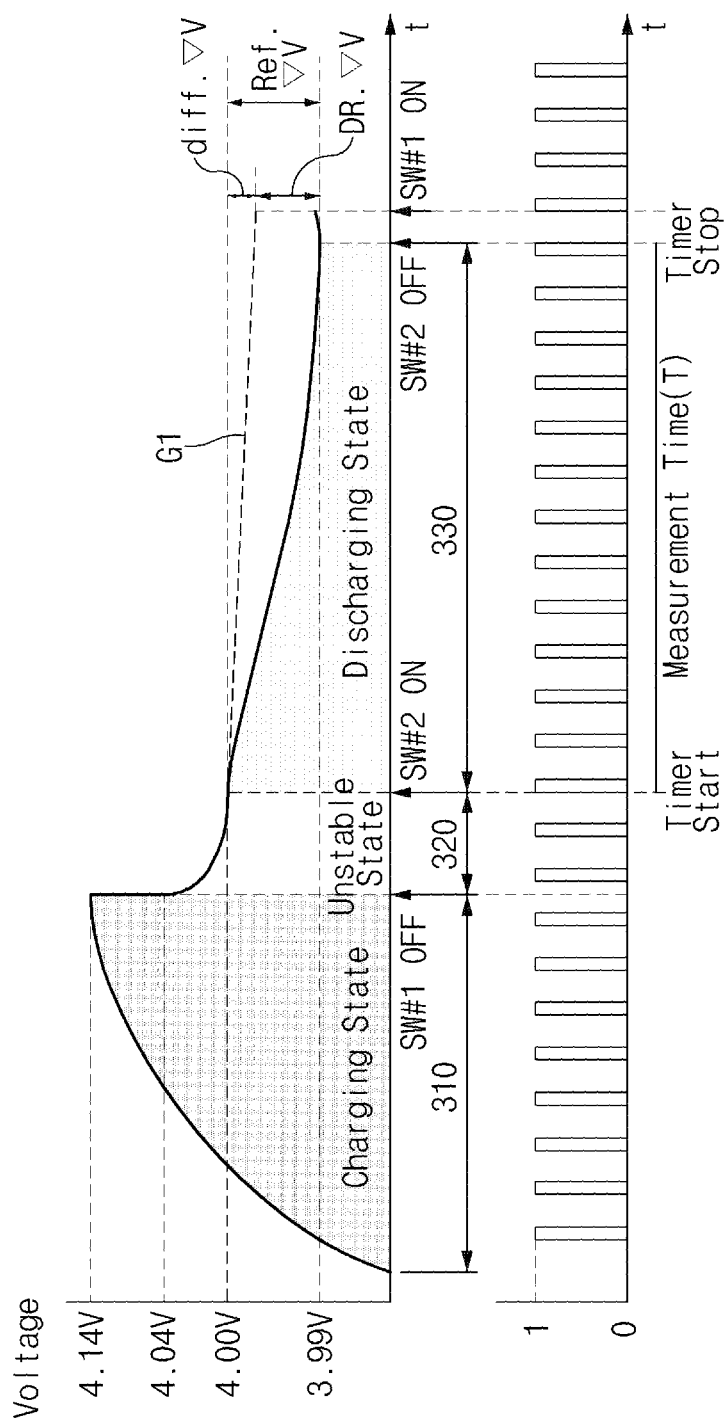
FIG. 3A is a graph describing a battery test process, according to an embodiment of the present disclosure.

FIG. 3A is a graph describing a battery test process, according to an embodiment of the present disclosure.

In FIG. 3A, the case in which a battery state is verified at a first time point related to a first period after the battery is fully charged will be described.

Referring to FIG. 3A, according to an embodiment of the present disclosure, as illustrated in an interval 310, in a state where the switch SW#1 is closed and the second switch SW#2 is open, the battery Bat1 may be charged by receiving a charging current from the charger 20 (charging state). In a battery charging state, a battery voltage may increase according to a charging characteristic of a battery cell.

According to an embodiment of the present disclosure, as illustrated in an interval 320, in a state where the switch SW#1 is open and the second switch SW#2 is closed, the battery Bat1 may be in no-load state. When the battery Bat1 is in the no-load state, the battery Bat1 may remain in an unstable state during a specific time period, and then the state of the battery Bat1 may be changed into a stable state. When the battery Bat1 is electrically disconnected from the charger 20 in a state where electric charges for charging from the charger 20 are concentrated on a positive terminal and a negative terminal of the battery Bat1, the electric charges concentrated on each terminal of the battery Bat1 are diffused to the entire area of a battery cell. For this reason, the unstable state may occur. The battery voltage in the unstable state may drop dramatically in a first time period (e.g., several seconds), the battery voltage may linearly decrease after the first time period (i.e., in a second time period). In the no-load state, it may take a considerable time (e.g., one hour) until the state of the battery Bat1 is switched to the stable state. As such, if a battery discharging is tested in no-load state, it may take a considerable time to wait for the battery to be in the stable state. However, when the battery Bat1 is artificially discharged by using the external resistor R3 after the first time period, whether the battery is abnormal (or a battery discharging characteristic) may be rapidly tested.

According to an embodiment of the present disclosure, as illustrated in an interval 330, if the second switch SW#2 is turn on, the battery Bat1 may be electrically connected with the external resistor R3 and may be discharged through the external resistor R3. The power management unit U1 may drive a timer at a point in time (the first time point) when the second switch SW#2 is closed and monitor a battery voltage. The power management unit U1 may measure a time required for the battery voltage to vary by a specified variation ∇V based on the battery voltage of the first time point by using the timer. The specified variation ∇V may be determined based on a first variation diff.∇V of the battery Bat1, which is related to a battery diffusion curve G1 during a critical time, and a second variation DR. ∇V of the battery Bat1 due to the external resistor R3. For example, the specified variation ∇V may be calculated by summing the first variation diff.∇V and the second variation DR. ∇V. The specified variation may be differently set according to the battery voltage of the first time point. For example, in the case where a diffusion characteristic of the battery differs according to the battery voltage, the specified variation ∇V may be set to be relatively greater at a battery voltage in which the diffusion of the battery is relatively faster.

According to an embodiment of the present disclosure, the power management unit U1 may determine whether the measured time T is less than the critical time. If the measured time is less than the critical time, the power management unit U1 may determine that the battery Bat1 is abnormal.

In FIG. 3A, the case in which the power management unit U1 tests the battery at the first time point that is related to the first period after the battery is fully charged is described. However, unlike the above description, the power management unit U1 may test the battery at the second time point that is related to the first period while the battery is charged. As such, a battery test frequency may be increased.

Figure 3B:
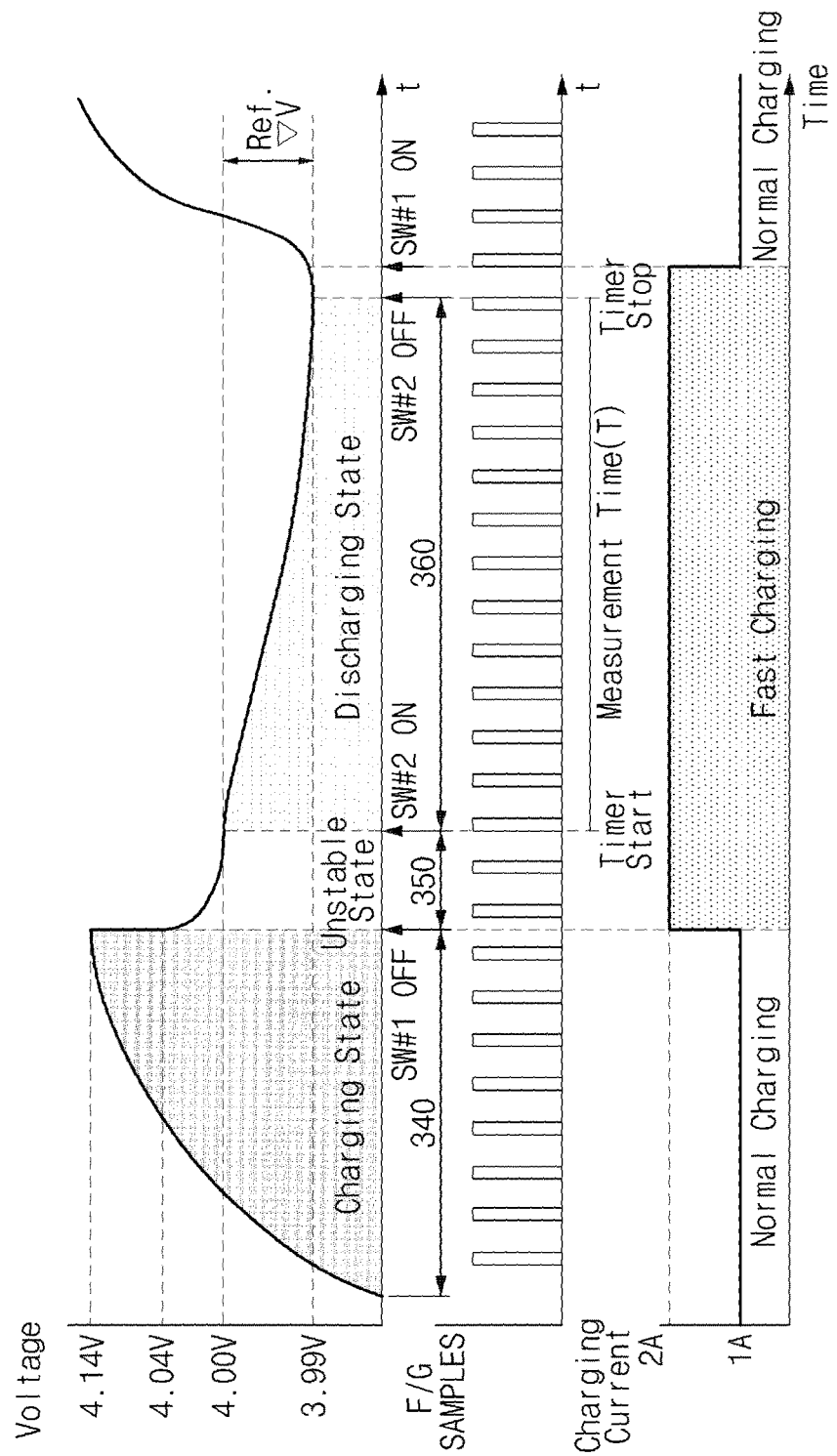
FIG. 3B is a graph describing a charging mode change in a battery test process, according to an embodiment of the present disclosure.

FIG. 3B is graph describing a charging mode change in a battery test process, according to an embodiment of the present disclosure.

Referring to FIG. 3B, according to an embodiment of the present disclosure, as illustrated in an interval 340, the power management unit U1 may compare the charging current I_CHG with the consumption current I_SYS at a time point, which is related to a first period within the interval 340. And the power management unit U1 may verify that the result of comparing the charging current I_CHG with the consumption current I_SYS does not satisfy a first condition. In this case, the power management unit U1 may determine whether the charger type of the charger 20 is a fast charger. If the charging mode of the battery is set as a normal charging mode in the case where the determined result indicates that the charger type is the fast charger, the power management unit U1 may close the first switch SW#1 and may change the charging mode into a fast charging mode. Compared with the normal charging mode, a charging current is relatively high in the fast charging mode. For example, if the charging current of the normal charging mode is about 1 A, the charging current of the fast charging mode may be about 2 A. The power management unit U1 may operate in the fast charging mode regardless of the charging state of a battery.

If the result of comparing the charging current I_CHG with the consumption current I_SYS satisfies the first condition as the charging mode is changed from the normal charging mode to the fast charging mode, as illustrated in intervals 350 and 360, the power management unit U1 may determine whether the battery is abnormal, in a state where the second switch is closed after the first switch is opened.

As such, in an embodiment of the present disclosure, since it is possible to increase the charging current by changing the charging mode in the first period, the power may be stably supplied to the electronic device during the battery test process and the battery test frequency may be relatively increased.

Figure 4:
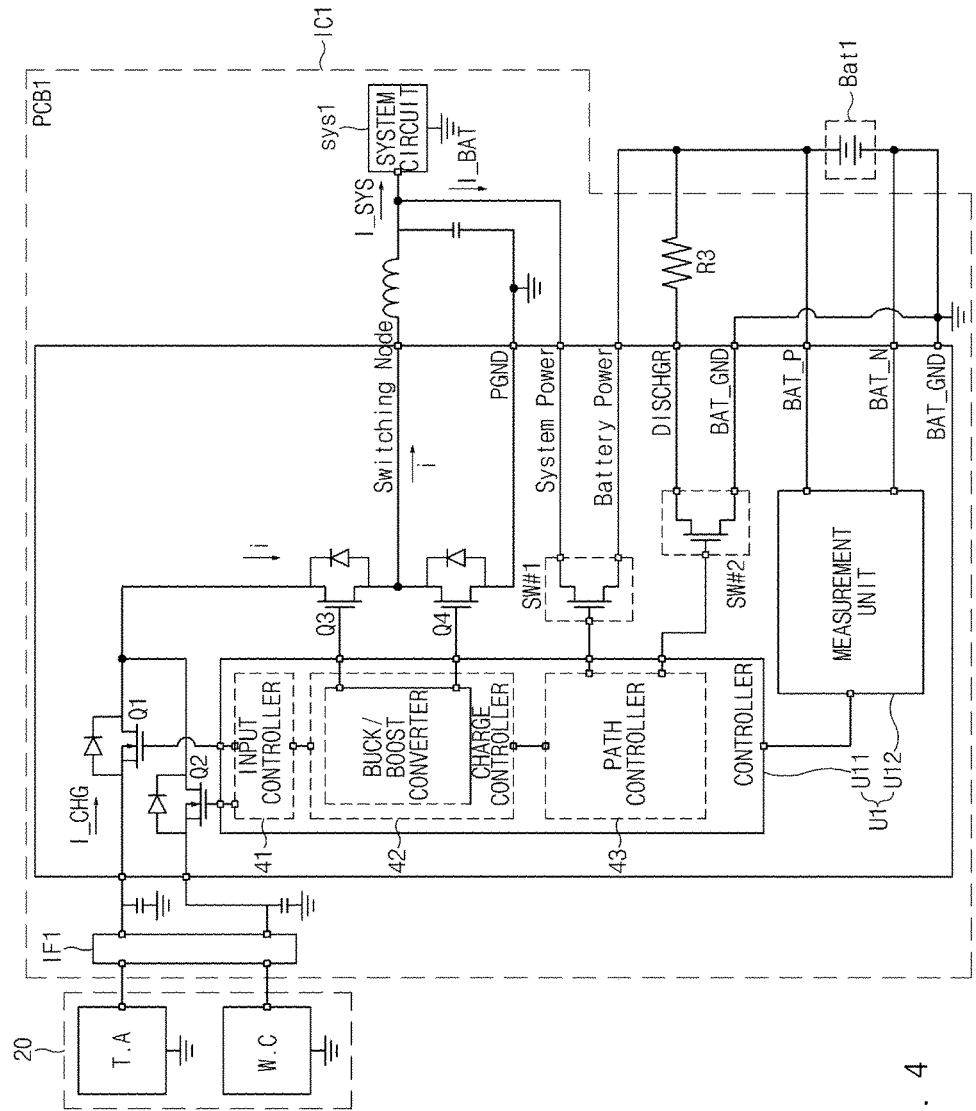
FIG. 4 is a circuit diagram schematically illustrating an electronic device in detail, according to an embodiment of the present disclosure.

FIG. 4 is a circuit diagram schematically illustrating an electronic device in detail, according to an embodiment of the present disclosure. For descriptive convenience, a partial configuration of the electronic device 10 is omitted in FIG. 4.

Referring to FIG. 4, according to an embodiment of the present disclosure, the power management unit U1, the first switch SW#1, and the second switch SW#2 may be implemented with one hardware block (e.g., an IC for power management). The power management unit U1 includes a measurement unit U12, an input controller 41, a charge controller 42, and a path controller 43. At least one of the input controller 41, the charge controller 42, and the path controller 43 may control the measurement unit U12. The input controller 41, the charge controller 42, and the path controller 43 may communicate with the processor U2 through a specified interface (e.g., I2C).

In an embodiment of the present disclosure, a first terminal of the first switch SW#1 may be connected to a power line of the system circuit sys1, a second terminal of the first switch SW#1 may be connected to one terminal of the battery Bat1. The first terminal and the second terminal of the first switch SW#1 may be shorted or opened under control of the path controller 43.

In an embodiment of the present disclosure, a first terminal of the second switch SW#2 may be connected to one terminal (e.g., +line) of the battery Bat1 by being connected in series to the external resistor R3, and a second terminal of the second switch SW#2 may be connected to the other terminal (e.g., −line or ground) of the battery Bat1. The first terminal and the second terminal of the second switch SW#2 may be shorted or opened under control of the path controller 43.

In an embodiment of the present disclosure, the measurement unit U12 may be connected to both terminals (+line and −line) of the battery Bat1 and may measure a battery state of charge (SOC). The measurement unit U12 may include a memory and may store a battery SOC and a battery state in the memory. For example, the battery state may include at least one of a full-charge state, a charging state, a low-battery state, no-load state, a self-discharge state, a battery testing state (a forced discharge state), and the like.

In an embodiment of the present disclosure, the input controller 41 may electrically connect at least one of a plurality of charging interfaces IF1, such as a USB (e.g., a micro-USB), a wireless charging coil, and the like, with the electronic device 10. For example, the input controller 41 may allow a charging current to be supplied from one of the plurality of charging interfaces IF1 to the electronic device 10 by controlling at least one of switching elements Q1 and Q2.

In an embodiment, the charge controller 42 may boost or buck a battery voltage or a charging voltage, which is supplied through the charging interface IF1, by controlling at least one of switching elements Q3 and Q4. For example, the charge controller 42 may buck the charging voltage that is supplied through the charging interface IF1 in a fast charging mode (e.g., in the case where the charging current is 3 A). As another example, in the case where the system circuit sys1 uses the battery current, the charge controller 42 may boost the input charging voltage.

In an embodiment of the present disclosure, the path controller 43 may control the first switch SW#1 and the second switch SW#2. For example, the path controller 43 may close the first switch SW#1 to charge the battery Bat1 by using the charging current of the charger 20. As another example, the path controller 43 may determine whether the charging current satisfies a first condition (or a stable condition) in the specified first period. If the charging current satisfies the first condition, the path controller 43 may open the first switch SW#1 and may close the second switch SW#2. As another example, in a state where the path controller 43 opens the first switch SW#1 and closes the second switch SW#2, the path controller 43 may test whether the battery Bat1 is abnormal, based on an electrical characteristic of a current applied to the external resistor R3, through the measurement unit U12. The path controller 43 may adjust a battery test frequency (the first period) based on usage status information received from the processor U2 or may adjust the battery test frequency under control of the processor U2. Since the power management unit U1 described with reference to FIGS. 2 and 3 mainly corresponds to the path controller 43, detailed descriptions of the path controller 43 are omitted in FIG. 4.

Figure 5:
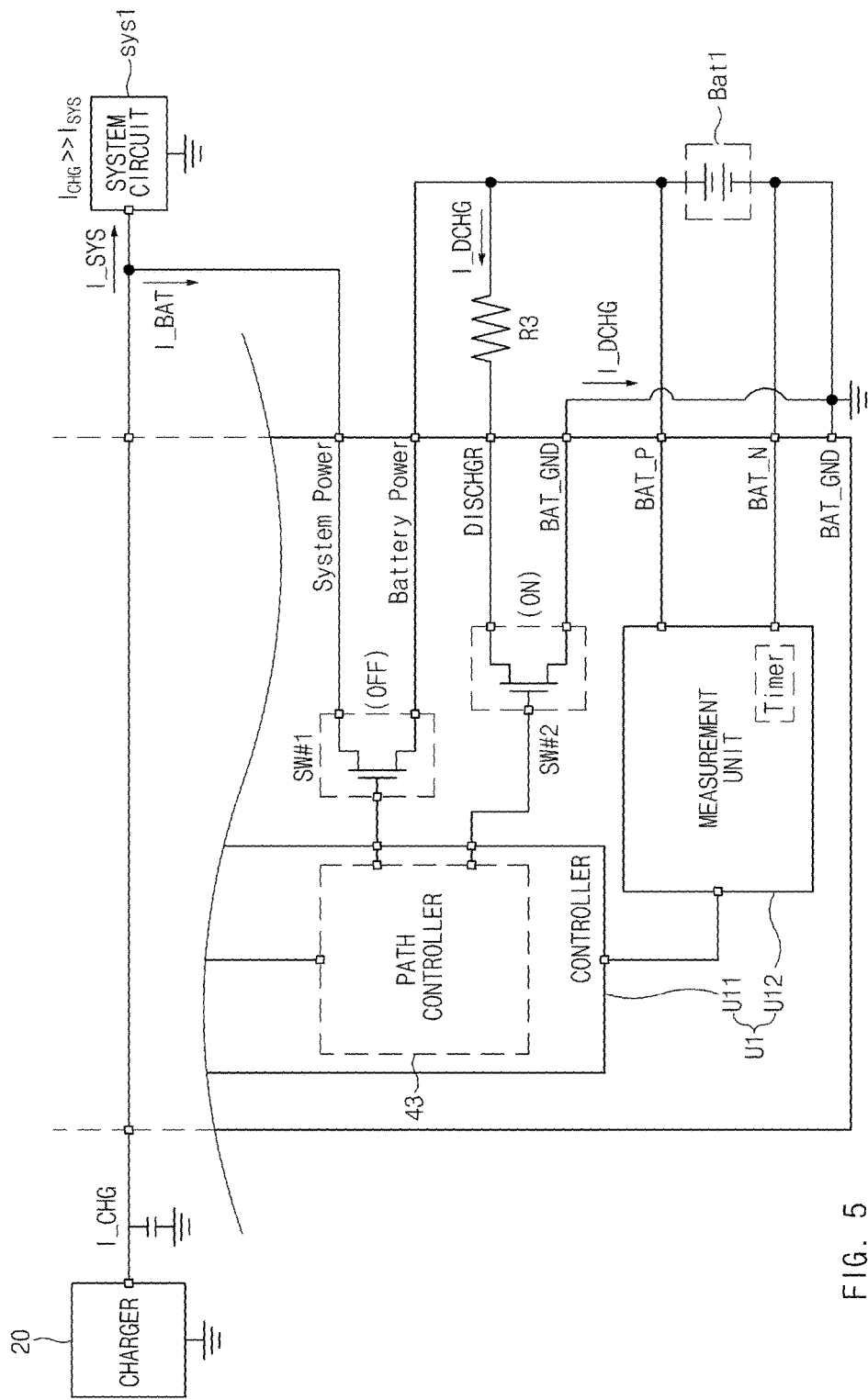
FIG. 5 is a circuit diagram schematically illustrating current flow during battery test of an electronic device, according to an embodiment of the present disclosure.

FIG. 5 is a circuit diagram describing current flow during a battery test of an electronic device, according to an embodiment of the present disclosure.

Referring to FIG. 5, according to an embodiment of the present disclosure, during the battery test (in the case where the first switch SW#1 is open and the second switch SW#2 is closed), the charging current I_CHG from the charger 20 may be applied to the system circuit sys1. A discharging current I_DCHG from the battery Bat1 may be discharged to a ground BAT_GND through the external resistor R3 and the second switch SW#2. As such, a battery discharging characteristic may be measured by measuring an electrical characteristic (e.g., a voltage between terminals of the external resistor R3) of a current applied to the external resistor R3.

Figure 6:
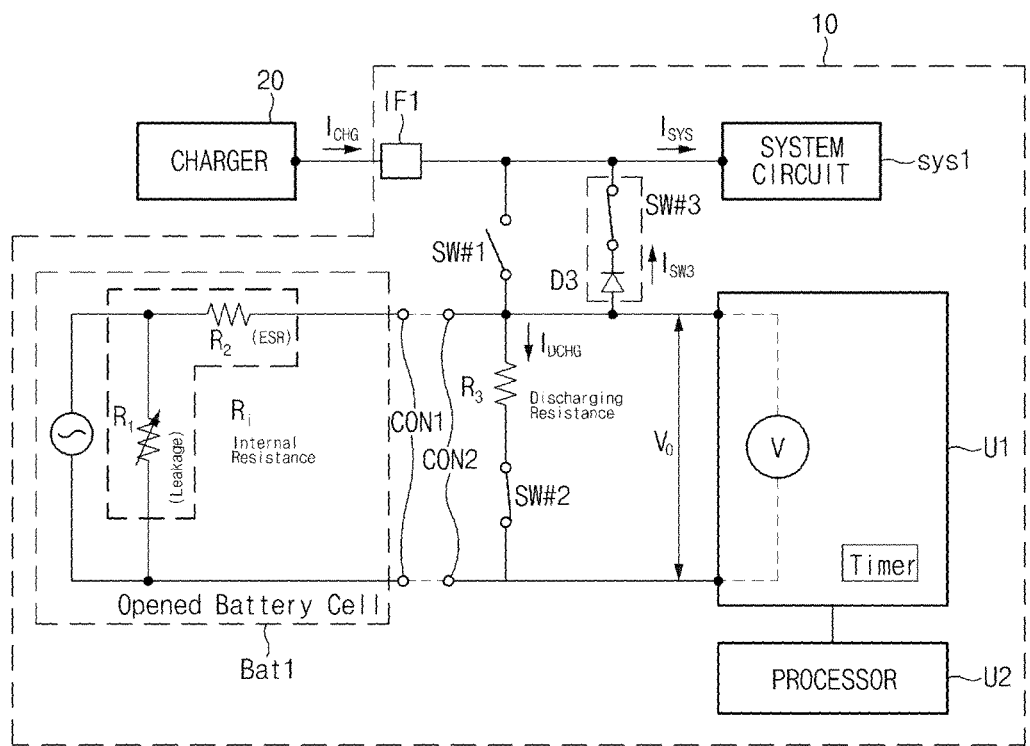
FIG. 6 is a circuit diagram schematically illustrating an electronic device, according to another embodiment of the present disclosure.

FIG. 6 is a circuit diagram schematically illustrating an electronic device, according to another embodiment of the present disclosure.

Referring to FIG. 6, according to an embodiment of the present disclosure, the electronic device 10 includes a battery Bat1, an external resistor R3, a first switch SW#1, a second switch SW#2, a third switch SW#3, a diode D3, a power management unit U1, and a system circuit sys1. In FIG. 3, the electronic device 10 is different in that the third switch SW#3 and the diode D3 are added and will be mainly described below.

According to an embodiment of the present disclosure, the third switch SW#3 may electrically connect or disconnect the battery Bat1 to or from the system circuit sys1. For example, when closed, the third switch SW#3 may electrically connect the battery Bat1 with the system circuit sys1. When open, the third switch SW#3 may electrically disconnect the battery Bat1 from the system circuit sys1. As another example, when closed, the third switch SW#3 may electrically connect the battery Bat1 with the system circuit sys1. For descriptive convenience, the former case will be described below. The third switch SW#3 may be controlled to be opposite to the first switch SW#1. For example, when the first switch SW#1 is closed, the third switch SW#3 may be open; when the first switch SW#1 is open, the third switch SW#3 may be closed. The third switch SW#3 may be configured to stably operate at a high charging current (e.g., about 1 A). For example, the third switch SW#3 may be a power transistor (e.g., a FET) that has low internal resistance.

According to an embodiment of the present disclosure, the diode D3 may be connected in series with the third switch SW#3. The diode D3 may allow a current to low in a first direction from the battery Bat1 to the system circuit sys1 and may block a current flowing in a second direction from the system circuit sys1 to the battery Bat1.

TABLE 2

| Charger connection state | First switch | Second switch | Third switch |
|---|---|---|---|
| Connection | Open | Closed after a first time period | Closed |
| Disconnection | Open | Open | Closed |
| Disconnection after a second time period | Closed | Open | Open |

According to an embodiment of the present disclosure, if the charging current satisfies a specified condition in a state where the charger 20 is connected with the charging interface IF1, the power management unit U1 may open the first switch SW#1 and may simultaneously close the third switch SW#3 to test a battery. As such, even though the charger 20 is separated from the charging interface IF1, the battery Bat1 may supply power to the electronic device 10. In the case where the controlling of the first and second switches SW#1 and SW#2 is delayed after the charger 20 is separated during the battery test, it may be prevented that the electronic device 10 is powered off since the battery Bat1 does not yet supply power to the electronic device 10.

According to an embodiment of the present disclosure, the power management unit U1 may open the first switch SW#1 and may close the third switch SW#3. After a first time period, the power management unit U1 may close the second switch SW#2 (refer to row 2 in Table 2).

According to an embodiment of the present disclosure, if the charger 20 is disconnected from the charging interface IF1 during the battery test, the power management unit U1 may open the second switch SW#2 (refer to row 3 in Table 2).

According to an embodiment of the present disclosure, the power management unit U1 may open the second switch SW#2, after a second time period, the power management unit U1 may close the first switch SW#1 and may close the third switch SW#3 (refer to row 4 in Table 2). The second time period may be experimentally determined based on a time in which the system circuit sys1 is stabilized at the power from the battery Bat1, which is different from the power of the charger 20, after power from the charger 20 is blocked.

According to an embodiment of the present disclosure, even though a user removes a charger or the electronic device 10 is out of a charging range of a wireless charger while the first switch SW#1 is being controlled (e.g., closed→opened or opened→closed), the electronic device 10 may be stably powered.

In the above-mentioned embodiment, the power management unit U1 controls the first to third switches SW#1 to SW#3. However, in another embodiment of the present disclosure, the first to third switches SW#1 to SW#3 may be controlled by the processor U2.

Figure 7:
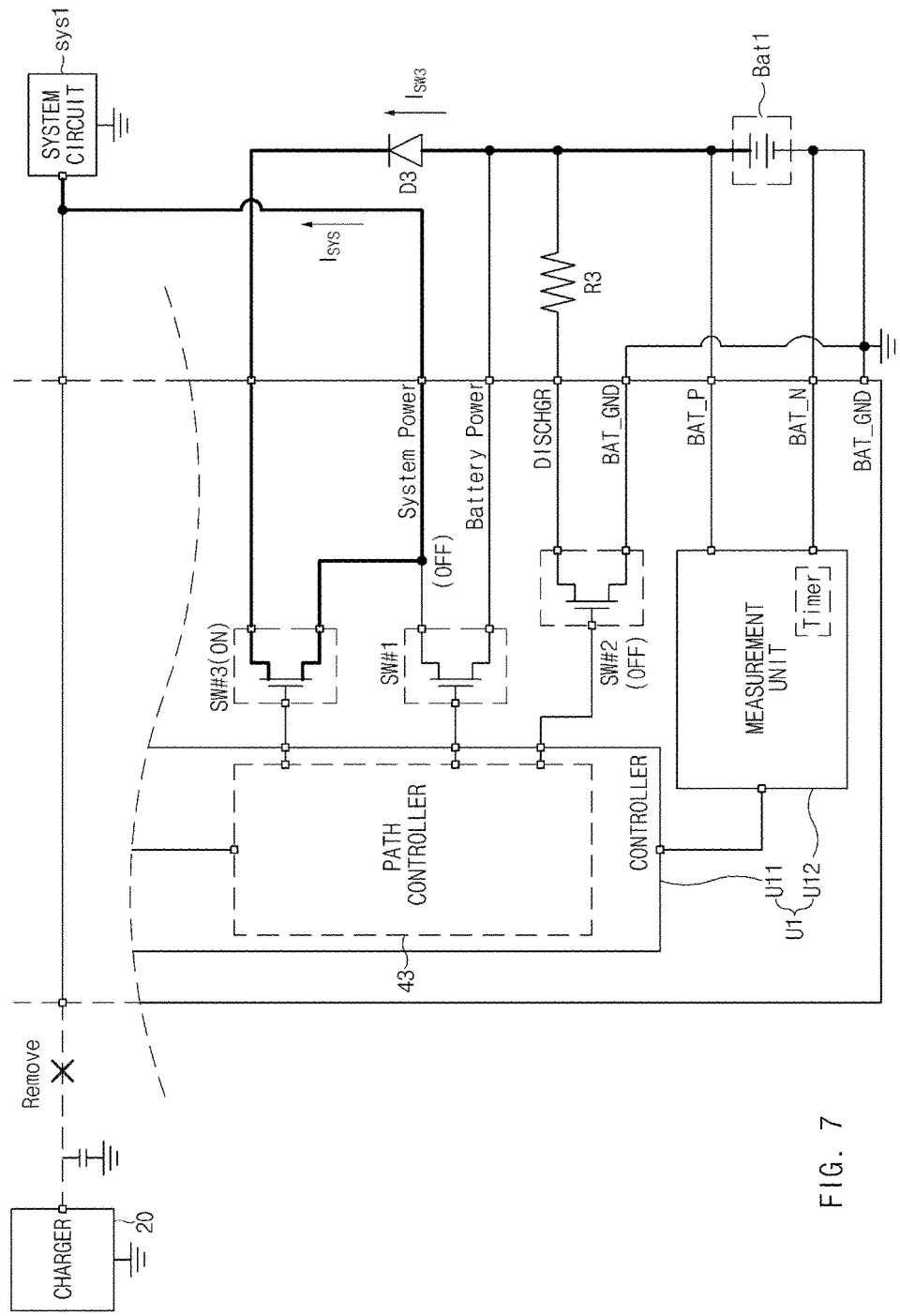
FIG. 7 is a circuit diagram schematically illustrating an electronic device in detail, according to another embodiment of the present disclosure.

FIG. 7 is a circuit diagram schematically illustrating an electronic device in detail, according to another embodiment of the present disclosure. For descriptive convenience, a partial configuration of the electronic device 10 is omitted in FIG. 7. Referring to FIG. 7, according to an embodiment of the present disclosure, the power management unit U1, the first switch SW#1, the second switch SW#2, and the third switch SW#3 may be implemented with one hardware block (e.g., an IC for power management). At least one of the first switch SW#1, the second switch SW#2, and the third switch SW#3 may be implemented by hardware that is separate from the power management unit U1.

In an embodiment of the present disclosure, a first terminal of the first switch SW#1 may be connected to a power line of the system circuit sys1. A second terminal of the first switch SW#1 may be connected to one terminal of the battery Bat1. The first terminal and the second terminal of the first switch SW#1 may be shorted or opened under control of the path control unit U11.

In an embodiment of the present disclosure, a first terminal of the second switch SW#2 may be connected to one terminal (e.g., +line) of the battery Bat1 by being connected in series to the external resistor R3 and a second terminal of the second switch SW#2 may be connected to another terminal (e.g., −line or ground) of the battery Bat1. The first terminal and the second terminal of the second switch SW#2 may be shorted or opened under control of the path control unit U11.

In an embodiment of the present disclosure, the anode of a diode D3 may be connected with one terminal (e.g., +line) of the battery Bat1, the cathode of the diode D3 may be connected with a first terminal of the third switch SW#3.

In an embodiment of the present disclosure, the first terminal of the third switch SW#3 may be connected with the cathode of the diode D3, the second terminal of the third switch SW#3 may be connected with the first terminal of the first switch SW#1 and the power line of the system circuit sys1. The first terminal and the second terminal of the third switch SW#3 may be shorted or opened under control of the path control unit U11.

According to an embodiment of the present disclosure, the power management unit U1 may include the path control unit U11. The path control unit U11 may control the first switch SW#1, the second switch SW#2, and the third switch SW#3. For example, the path control unit U11 may determine whether the charging current satisfies a first condition (or a stable condition) in the specified first period. If the charging current satisfies the first condition, the path control unit U11 may open the first switch SW#1 and may close the third switch SW#3. The path control unit U11 may close the second switch SW#2 to test a battery after a first time period from a point in time when the first switch SW#1 is opened and the third switch SW#3 is closed. As another example, in a state where the path control unit U11 opens the first switch SW#1 and closes the second switch SW#2 and the third switch SW#3, the path controller 43 may test whether the battery Bat1 is abnormal, based on an electrical characteristic of a current applied to the external resistor R3, through the measurement unit U12. As another example, if the charger 20 is disconnected from the charging interface IF1 during the battery test, the path control unit U11 may open the second switch SW#2. The path control unit U11 may open the second switch SW#2 after a second time period, the path control unit U11 may close the first switch SW#1 and may open the third switch SW#3.

Figure 8:
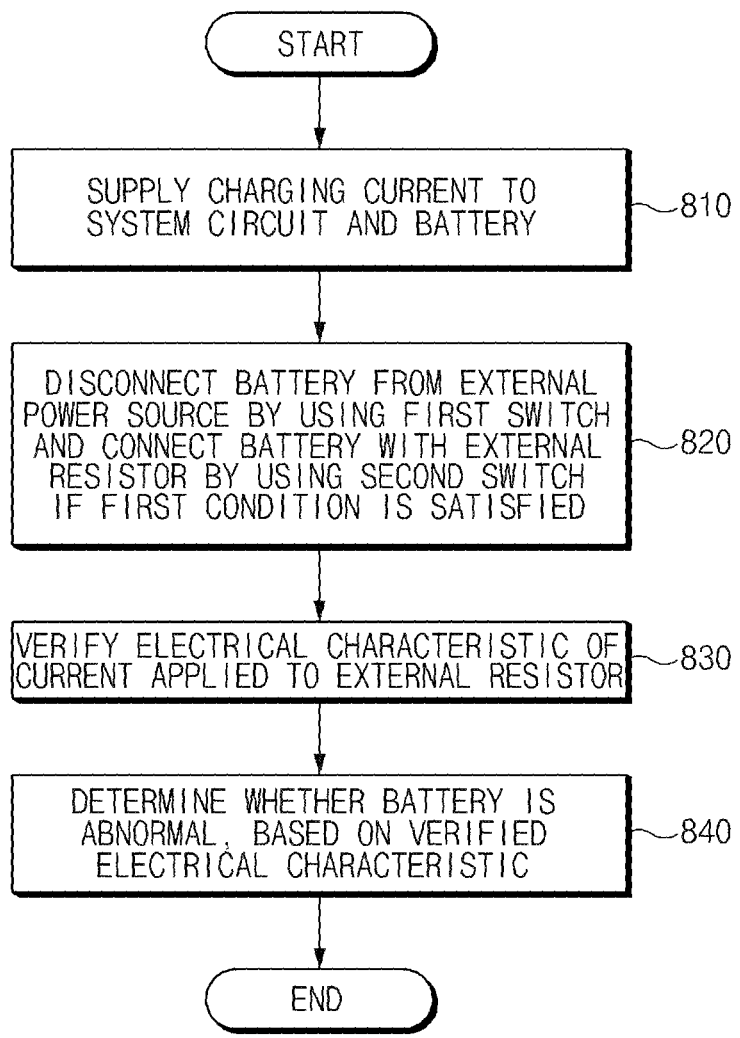
FIG. 8 is a flowchart of a method of controlling an electronic device, according to an embodiment of the present disclosure.

FIG. 8 is a flowchart of a method of controlling an electronic device, according to an embodiment of the present disclosure.

Referring to FIG. 8, in operation 810, the power management unit U1 distributes and supplies a charging current to the system circuit sys1 and the battery Bat1. For example, the power management unit U1 may electrically connect the system circuit sys1 with the battery Bat1 by closing the first switch SW#1 that electrically connects or disconnects the battery Bat1 to or from the system circuit sys1. In this case, the charging current may be applied through the charging interface IF1 and may be distributed and supplied to the system circuit sys1 and the battery Bat1.

In operation 820, in the case where the charging current satisfies the specified condition, the power management unit U1 electrically disconnects the battery Bat1 from the charger 20 by using the first switch SW#1 and may electrically connect the battery Bat1 with the external resistor R3 by using the second switch SW#2. The power management unit U1 may disconnect the battery Bat1 from the charger 20, after a first time period, the power management unit U1 may electrically connect the battery Bat1 with the external resistor R3. The first time period may be experimentally determined as a time required for the battery Bat1 to be relatively stable after the charging current from the charger 20 is interrupted. For example, the specified condition may be that the charging current is not less than a specified multiple (e.g., twice) of the consumption current.

In operation 830, after the power management unit U1 disconnects the battery Bat1 from the charger 20 and connects the battery Bat1 with the external resistor R3, the power management unit U1 verifies the electrical characteristic of a current applied to the external resistor R3 by forcibly discharging the battery Bat1 using the external resistor R3. For example, the power management unit U1 may monitor a variation in a voltage between both terminals of the external resistor R3 over time from a point in time when the power management unit U1 closes the second switch SW#2. The power management unit U1 may measure a time required for the monitored variation to vary by a specified variation.

In operation 840, the power management unit U1 determines whether the battery is abnormal, based on the verified electrical characteristic. For example, the power management unit U1 may compare the measured time with the critical time. If the measured time is less than the critical time, the power management unit U1 may determine whether the battery is abnormal. If the measured time is greater than the critical time, the power management unit U1 may determine that the battery is normal.

Figure 9:
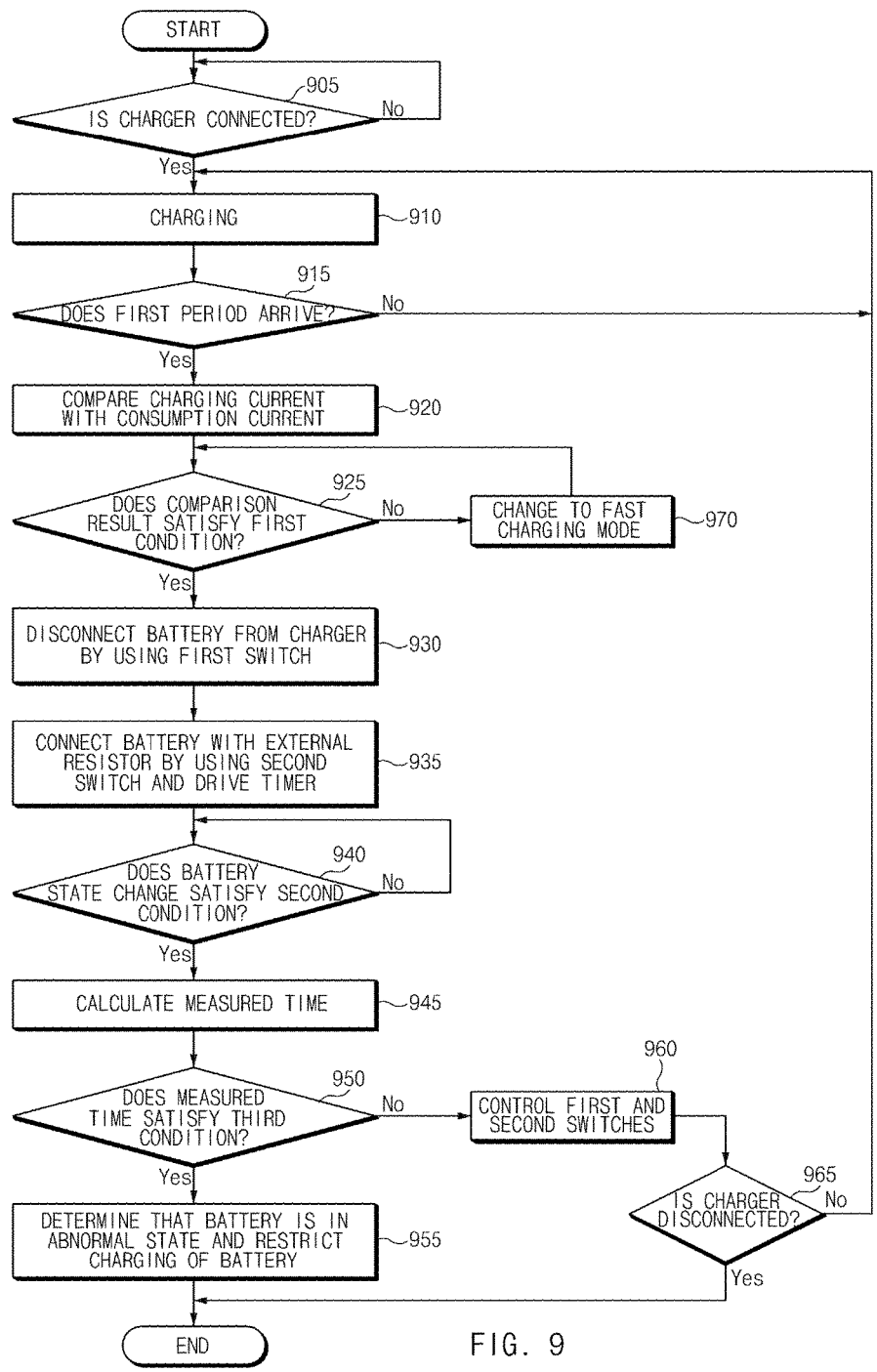
FIG. 9 is a flowchart of a method of controlling an electronic device in detail, according to an embodiment of the present disclosure.

FIG. 9 is a flowchart of a method of controlling an electronic device in detail, according to an embodiment of the present disclosure.

Referring to FIG. 9, in operation 905, the power management unit U1 monitors whether the charger 20 is connected to the charging interface IF1.

In operation 910, if the charger 20 is connected to the charging interface IF1, the power management unit U1 supplies a charging current of the charger 20 to the battery Bat1. The power management unit U1 may additionally supply the charging current of the charger 20 to the system circuit sys1. The power management unit U1 may electrically connect the battery Bat1 with the charger 20 by using the first switch SW#1.

In operation 915, the power management unit U1 monitors whether a first period (e.g., 30 minutes) for battery test arrives while charging the battery Bat1. The first period may be adjusted according to a usage status of the electronic device 10.

In operation 920, if the first period elapses, the power management unit U1 compares the charging current supplied to the charging interface IF1 with the consumption current of the system circuit sys1 supplied to the system circuit sys1. The first period may be adjusted according to a usage status of the electronic device 10.

In operation 925, the power management unit U1 determines whether the result of comparing the charging current with the consumption current satisfies a first condition. For example, the first condition may be that the charging current is not less than a specified multiple (e.g., twice) of the consumption current.

In operation 930, the power management unit U1 electrically disconnects the battery Bat1 from the charger 20 by using the first switch SW#1. In operation 930, the power management unit U1 may maintain a path that allows the charging current from the charger 20 to be supplied to the system circuit sys1.

In operation 935, the power management unit U1 electrically connects the battery Bat1 with the external resistor R3 by using the second switch SW#2. For example, the power management unit U1 may connect the battery Bat1 with the external resistor R3 after the power management unit U1 disconnects the battery Bat1 from the charger 20 and a first time period elapses. The first time period may be experimentally determined as a time required for the battery Bat1 to be relatively stable after the charging current from the charger 20 is interrupted. In operation 935, the power management unit U1 drives a timer that measures a battery discharging characteristic.

In operation 940, the power management unit U1 monitors whether a battery state change satisfies a second condition. For example, the second condition may be that a battery voltage is changed by a specified variation from a point in time when the battery Bat1 is connected with the external resistor R3.

In operation 945, if the battery state change satisfies the second condition, the power management unit U1 calculates the time measured by using the timer. For example, the measured time may be a time required for the battery voltage to vary by a specified variation from a point in time when the battery Bat1 is connected with the external resistor R3.

In operation 950, the power management unit U1 determines whether the measured time satisfies a third condition. The third condition may be a condition for determining whether the battery is abnormal and, for example, may be that the measured time is less than the critical time. The critical time may be the time that is experimentally measured by using a normal battery.

In operation 955, if the measured time satisfies the third condition, the power management unit U1 determines that the battery is in an abnormal state. If it is determined that the battery is in the abnormal state, the power management unit U1 may restrict the charging of the battery Bat1.

In operation 960, if the measured time does not satisfy the third condition, the power management unit U1 determines that the battery is normal, and controls the first and second switches SW#1 and SW#2 such that the charging current of the charger 20 is supplied to the battery Bat1. For example, the power management unit U1 may electrically connect the battery Bat1 with the charger 20 by using the first switch SW#1 and may electrically disconnect the battery Bat1 from the external resistor R3 by using the second switch SW#2. In operation 960, an order in which the power management unit U1 controls the first and second switches SW#1 and SW#2 may be experimentally determined based on power stability of an electronic device.

In operation 965, after controlling the first and second switches SW#1 and SW#2, the power management unit U1 determines whether the charger 20 is disconnected from the charging interface IF1. If the charger 20 is connected with the charging interface IF1, the power management unit U1 may charge the battery. If the charger 20 is disconnected from the charging interface IF1, the power management unit U1 may end the battery charging.

If the verification result of operation 925 indicates that the result of comparing the charging current with the consumption current does not satisfy the first condition, in operation 970, the power management unit U1 changes the charging mode to a fast charging mode. For example, the power management unit U1 may verify a charger type of the charger 20 connected to the charging interface IF1. If the power management unit U1 is in a normal charging mode and the charger type is a fast charger, the power management unit U1 may change the charging mode into the fast charging mode. The fast charging mode may be a mode in which the charging current from the charger 20 is relatively higher than the charging current in the normal charging mode. As such, it may be possible to stably supply the charging current from the charger 20 to the electronic device 10 in a battery test process.

Figure 10:
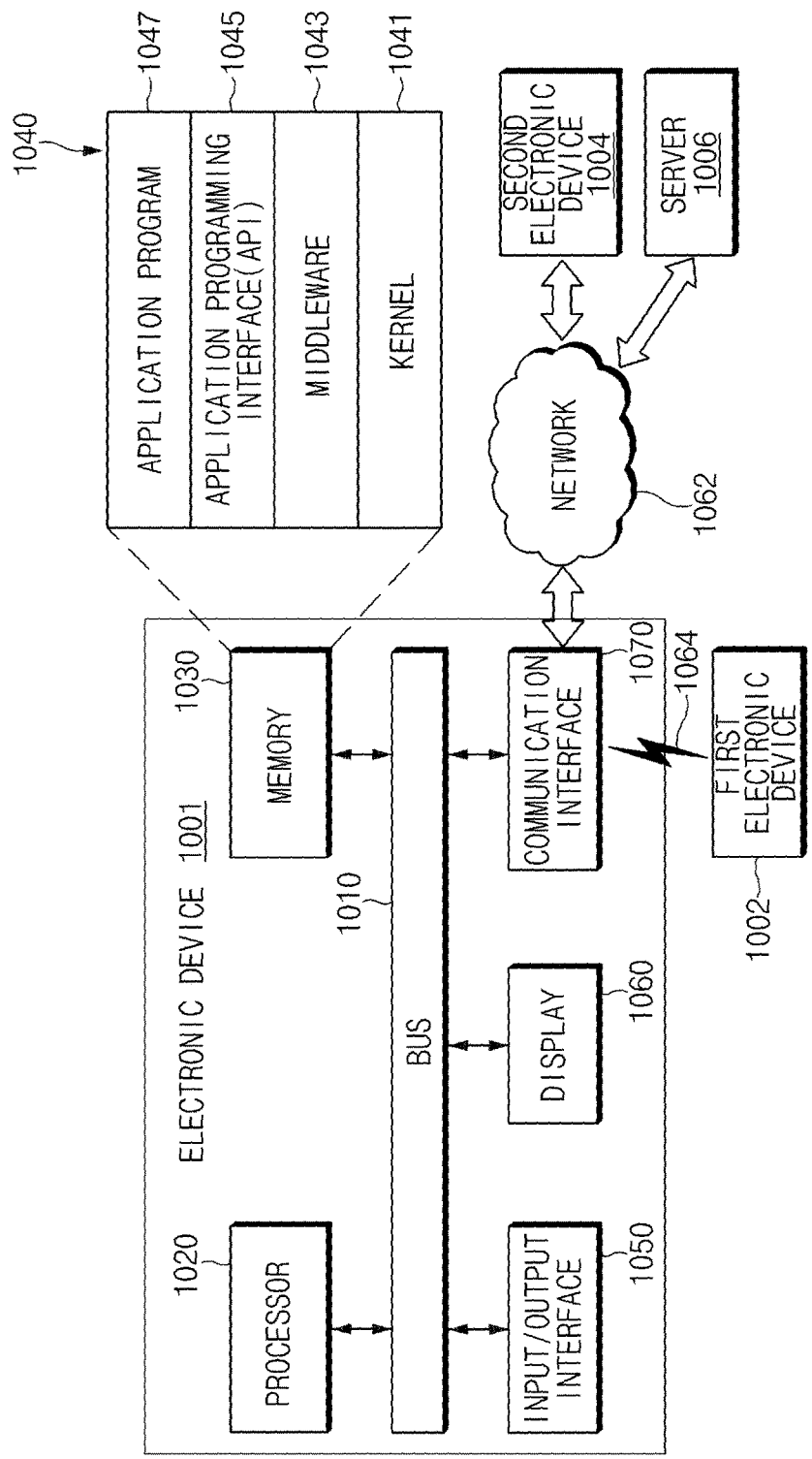
FIG. 10 illustrates an electronic device in a network environment system, according to an embodiment of the present disclosure.

FIG. 10 illustrates an electronic device in a network environment system, according to embodiment of the present disclosure.

Referring to FIG. 10, according to an embodiment of the present disclosure, an electronic device 1001, a first electronic device 1002, a second electronic device 1004, or a server 1006 may be connected each other over a network 1062 or a short range communication 1064. The electronic device 1001 includes a bus 1010, a processor 1020, a memory 1030, an input/output interface 1050, a display 1060, and a communication interface 1070. The electronic device 1001 may not include at least one of the above-described elements or may further include other element(s).

For example, the bus 1010 may interconnect the above-described elements 1010 to 1070 and may include a circuit for conveying communications (e.g., a control message and/or data) among the above-described elements.

The processor 1020 may include one or more of a central processing unit (CPU), an application processor (AP), or a communication processor (CP). For example, the processor 1020 may perform an arithmetic operation or data processing associated with control and/or communication of at least other elements of the electronic device 1001.

The memory 1030 may include a volatile and/or nonvolatile memory. For example, the memory 1030 may store instructions or data associated with at least one other element(s) of the electronic device 1001. According to an embodiment of the present disclosure, the memory 1030 stores software and/or a program 1040. The program 1040 includes, for example, a kernel 1041, a middleware 1043, an application programming interface (API) 1045, and/or an application program (or "an application") 1047. At least a part of the kernel 1041, the middleware 1043, or the API 1045 may be referred to as an operating system (OS).

For example, the kernel 1041 may control or manage system resources (e.g., the bus 1010, the processor 1020, the memory 1030, and the like) that are used to execute operations or functions of other programs (e.g., the middleware 1043, the API 1045, and the application 1047). Furthermore, the kernel 1041 may provide an interface that allows the middleware 1043, the API 1045, or the application 1047 to access discrete elements of the electronic device 1001 so as to control or manage system resources.

The middleware 1043 may perform, for example, a mediation role such that the API 1045 or the application 1047 communicates with the kernel 1041 to exchange data. Furthermore, the middleware 1043 may process task requests received from the application 1047 according to a priority. For example, the middleware 1043 may assign the priority, which makes it possible to use a system resource (e.g., the bus 1010, the processor 1020, the memory 1030, and the like) of the electronic device 1001, to at least one of the application 1047. For example, the middleware 1043 may process the one or more task requests according to the priority assigned to the at least one, which makes it possible to perform scheduling or load balancing on the one or more task requests.

The API 1045 may be, for example, an interface through which the application 1047 controls a function provided by the kernel 1041 or the middleware 1043, and may include, for example, at least one interface or function (e.g., an instruction) for a file control, a window control, image processing, a character control, and the like.

The input/output interface 1050 may play a role, for example, of an interface which transmits an instruction or data input from a user or another external device, to other element(s) of the electronic device 1001. Furthermore, the input/output interface 1050 may output an instruction or data, received from other element(s) of the electronic device 1001, to a user or another external device.

The display 1060 may include, for example, a liquid crystal display (LCD), a light-emitting diode (LED) display, an organic LED (OLED) display, a microelectromechanical systems (MEMS) display, or an electronic paper display. The display 1060 may display, for example, various content (e.g., a text, an image, a video, an icon, a symbol, and the like) to a user. The display 1060 may include a touch screen and may receive, for example, a touch, gesture, proximity, or hovering input using an electronic pen or a part of a user's body.

The communication interface 1070 may establish communication between the electronic device 1001 and the first electronic device 1002, the second electronic device 1004, or the server 1006. For example, the communication interface 1070 may be connected to the network 1062 over wireless communication or wired communication to communicate with the second electronic device 1004 or the server 1006.

The wireless communication may use at least one of, for example, long-term evolution (LTE), LTE advanced (LTE-A), code division multiple access (CDMA), wideband CDMA (WCDMA), universal mobile telecommunications system (UMTS), wireless broadband (WiBro), global system for mobile communications (GSM), and the like, as cellular communication protocol. Furthermore, the wireless communication may include, for example, the short range communication 1064. The short range communication 1064 may include at least one of wireless fidelity (Wi-Fi), light fidelity (Li-Fi), Bluetooth, near field communication (NFC), magnetic stripe transmission (MST), a global navigation satellite system (GNSS), and the like.

The MST may generate a pulse in response to transmission data using an electromagnetic signal, and the pulse may generate a magnetic field signal. The electronic device 1001 may transfer the magnetic field signal to a POS terminal, and the POS terminal may detect the magnetic field signal using a MST reader. The POS may recover the data by converting the detected magnetic field signal to an electrical signal.

The GNSS may include at least one of, for example, a global positioning system (GPS), a global navigation satellite system (Glonass), a Beidou navigation satellite system (Beidou), or a European global satellite-based navigation system (Galileo) based on an available region, a bandwidth, and the like. Hereinafter, in the present disclosure, the terms "GPS" and "GNSS" may be interchangeably used. The wired communication may include at least one of, for example, a universal serial bus (USB), a high definition multimedia interface (HDMI), a recommended standard-232 (RS-232), a plain old telephone service (POTS), and the like. The network 1062 may include at least one of telecommunications networks, for example, a computer network (e.g., LAN or WAN), the Internet, or a telephone network.

Each of the first and second electronic devices 1002 and 1004 may be a device of which the type is different from or the same as that of the electronic device 1001. According to an embodiment of the present disclosure, the server 1006 may include a group of one or more servers. All or a portion of operations that the electronic device 1001 will perform may be executed by another or the first electronic device 1002, the second electronic device 1004 or the server 1006. In the case where the electronic device 1001 executes any function or service automatically or in response to a request, the electronic device 1001 may not perform the function or the service internally, but, alternatively additionally, it may request at least a portion of a function associated with the electronic device 1001 be performed with the electronic device 1002 or 1004 or the server 1006. The other electronic device may execute the requested function or additional function and may transmit the execution result to the electronic device 1001. The electronic device 1001 may provide the requested function or service using the received result or may additionally process the received result to provide the requested function or service. To this end, for example, cloud computing, distributed computing, or client-server computing may be used.

Figure 11:
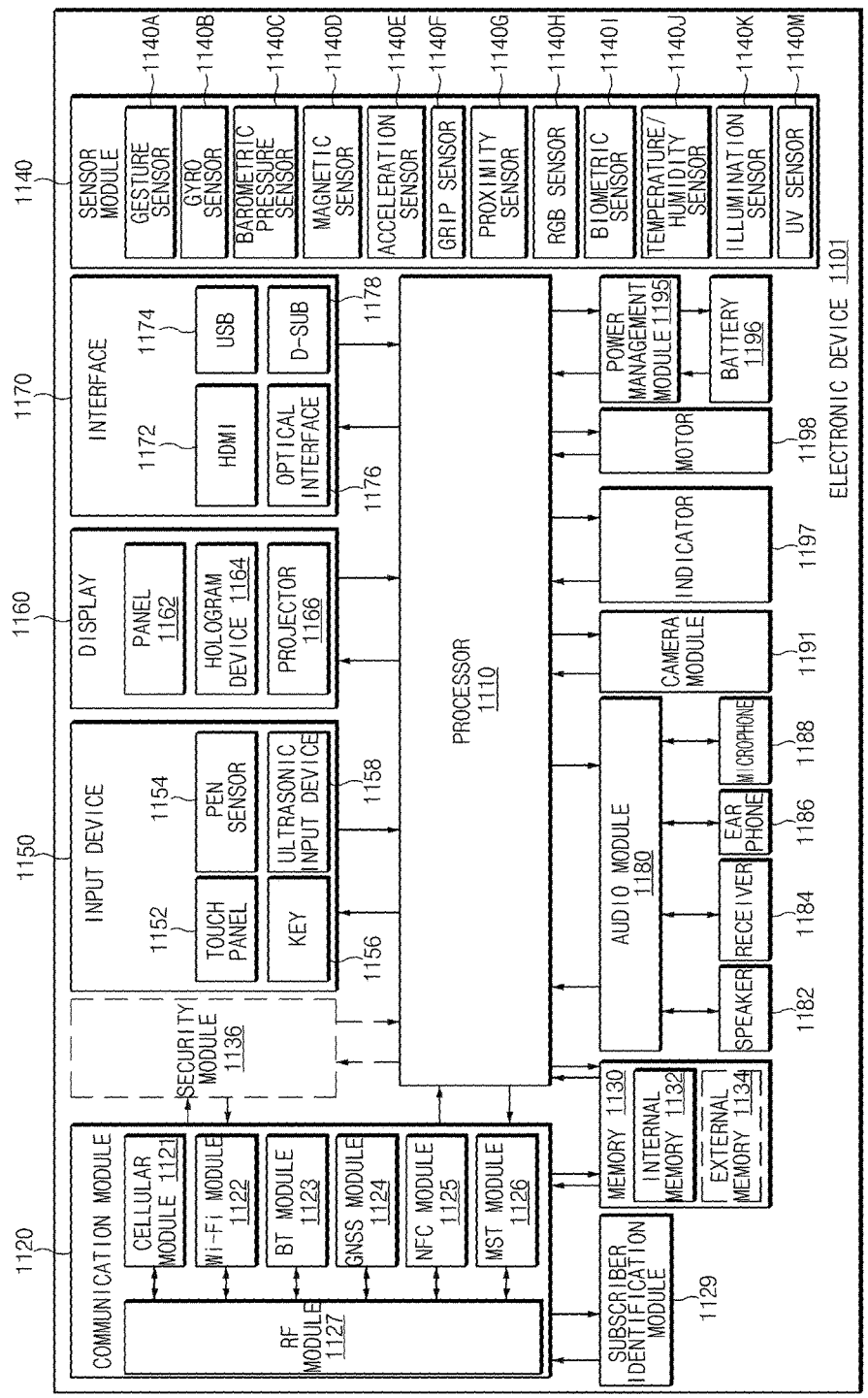
FIG. 11 illustrates a block diagram of an electronic device, according to an embodiment of the present disclosure.

FIG. 11 illustrates a block diagram of an electronic device, according to an embodiment of the present disclosure.

Referring to FIG. 11, an electronic device 1101 may include, for example, all or a part of the electronic device 1001 illustrated in FIG. 10. The electronic device 1101 includes one or more application processors AP 1110, a communication module 1120, a subscriber identification module 1129, a memory 1130, a sensor module 1140, an input device 1150, a display 1160, an interface 1170, an audio module 1180, a camera module 1191, a power management module 1195, a battery 1196, an indicator 1197, and a motor 1198.

The processor 1110 may drive, for example, an operating system (OS) or an application to control a plurality of hardware or software elements connected to the processor 1110 and may process and compute a variety of data. For example, the processor 1110 may be implemented with a system on chip. According to an embodiment of the present disclosure, the processor 1110 may further include a graphic processing unit (GPU) and/or an image signal processor. The processor 1110 may include at least a part (e.g., a cellular module 1121) of elements illustrated in FIG. 11. The processor 1110 may load an instruction or data, which is received from at least one of other elements (e.g., a nonvolatile memory), into a volatile memory and process the loaded instruction or data. The processor 1110 may store a variety of data in the nonvolatile memory.

The communication module 1120 may be configured the same as or similar to the communication interface 1070 of FIG. 10. The communication module 1120 includes the cellular module 1121, a Wi-Fi module 1122, a Bluetooth™ (BT) module 1123, a GNSS module 1124 (e.g., a GPS module, a Glonass module, a Beidou module, or a Galileo module), a near field communication (NFC) module 1125, a MST module 1126 and a radio frequency (RF) module 1127.

The cellular module 1121 may provide, for example, voice communication, video communication, a character service, an Internet service, and the like over a communication network. According to an embodiment of the present disclosure, the cellular module 1121 may perform discrimination and authentication of the electronic device 1101 within a communication network by using the subscriber identification module (e.g., a SIM card) 1129. The cellular module 1121 may perform at least a portion of functions that the processor 1110 provides. The cellular module 1121 may include a communication processor (CP).

Each of the Wi-Fi module 1122, the BT module 1123, the GNSS module 1124, the NFC module 1125, or the MST module 1126 may include a processor for processing data exchanged through a corresponding module, for example. According to an embodiment of the present disclosure, at least a part (e.g., two or more) of the cellular module 1121, the Wi-Fi module 1122, the BT module 1123, the GNSS module 1124, the NFC module 1125, or the MST module 1126 may be included within one integrated circuit (IC) or an IC package.

For example, the RF module 1127 may transmit and receive a communication signal (e.g., an RF signal). For example, the RF module 1127 may include a transceiver, a power amplifier module (PAM), a frequency filter, a low noise amplifier (LNA), an antenna, and the like. According to another embodiment of the present disclosure, at least one of the cellular module 1121, the Wi-Fi module 1122, the BT module 1123, the GNSS module 1124, the NFC module 1125, or the MST module 1126 may transmit and receive an RF signal through a separate RF module.

The subscriber identification module 1129 may include, for example, a card and/or embedded SIM that includes a subscriber identification module and may include unique identify information (e.g., integrated circuit card identifier (ICCID)) or subscriber information (e.g., integrated mobile subscriber identity (IMSI)).

The memory 1130 (e.g., the memory 1030) includes an internal memory 1132 or an external memory 1134. For example, the internal memory 1132 may include at least one of a volatile memory (e.g., a dynamic random access memory (DRAM), a static RAM (SRAM), a synchronous DRAM (SDRAM), and the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), and the like), a hard drive, or a solid state drive (SSD).

The external memory 1134 may further include a flash drive such as compact flash (CF), secure digital (SD), micro secure digital (micro-SD), mini secure digital (mini-SD), extreme digital (xD), a multimedia card (MMC), a memory stick, and the like. The external memory 1134 may be operatively and/or physically connected to the electronic device 1101 through various interfaces.

A security module 1136 may be a module that includes a storage space of which a security level is higher than that of the memory 1130 and may be a circuit that guarantees safe data storage and a protected execution environment. The security module 1136 may be implemented with a separate circuit and may include a separate processor. For example, the security module 1136 may be in a smart chip or a secure digital (SD) card, which is removable, or may include an embedded secure element (eSE) embedded in a fixed chip of the electronic device 1101. Furthermore, the security module 1136 may operate based on an operating system (OS) that is different from the OS of the electronic device 1101. For example, the security module 1136 may operate based on java card open platform (JCOP) OS.

The sensor module 1140 may measure, for example, a physical quantity or may detect an operation state of the electronic device 1101. The sensor module 1140 may convert the measured or detected information to an electric signal. For example, the sensor module 1140 includes at least one of a gesture sensor 1140A, a gyro sensor 1140B, a barometric pressure sensor 1140C, a magnetic sensor 1140D, an acceleration sensor 1140E, a grip sensor 1140F, the proximity sensor 1140G, a color sensor 1140H (e.g., red, green, blue (RGB) sensor), a biometric sensor 1140I, a temperature/humidity sensor 1140J, an illuminance sensor 1140K, or an UV sensor 1140M. The sensor module 1140 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1140 may further include a control circuit for controlling at least one or more sensors included therein. According to an embodiment of the present disclosure, the electronic device 1101 may further include a processor that is a part of the processor 1110 or independent of the processor 1110 and is configured to control the sensor module 1140. The processor may control the sensor module 1140 while the processor 1110 remains at a sleep state.

The input device 1150 includes, for example, a touch panel 1152, a (digital) pen sensor 1154, a key 1156, or an ultrasonic input unit 1158. For example, the touch panel 1152 may use at least one of capacitive, resistive, infrared and ultrasonic detecting methods. Also, the touch panel 1152 may further include a control circuit. The touch panel 1152 may further include a tactile layer to provide a tactile reaction to a user.

The (digital) pen sensor 1154 may be, for example, a part of a touch panel or may include an additional sheet for recognition. The key 1156 may include, for example, a physical button, an optical key, a keypad, and the like. The ultrasonic input device 1158 may detect (or sense) an ultrasonic signal, which is generated from an input device, through a microphone 1188 and may check data corresponding to the detected ultrasonic signal.

The display 1160 (e.g., the display 1060) may include a panel 1162, a hologram device 1164, or a projector 1166. The panel 1162 may be the same as or similar to the display 1060 illustrated in FIG. 10. The panel 1162 may be implemented, for example, to be flexible, transparent or wearable. The panel 1162 and the touch panel 1152 may be integrated into a single module. The hologram device 1164 may display a stereoscopic image in a space using a light interference phenomenon. The projector 1166 may project light onto a screen so as to display an image. For example, the screen may be arranged in the inside or the outside of the electronic device 1101. According to an embodiment of the present disclosure, the display 1160 may further include a control circuit for controlling the panel 1162, the hologram device 1164, or the projector 1166.

The interface 1170 includes, for example, a high-definition multimedia interface (HDMI) 1172, a universal serial bus (USB) 1174, an optical interface 1176, or a D-subminiature (D-sub) 1178. The interface 1170 may be included, for example, in the communication interface 1070 illustrated in FIG. 10. Additionally or generally, the interface 1170 may include, for example, a mobile high definition link (MHL) interface, a SD card/multi-media card (MMC) interface, or an infrared data association (IrDA) standard interface.

The audio module 1180 may convert a sound and an electric signal in dual directions. At least a part of the audio module 1180 may be included, for example, in the input/output interface 1050 illustrated in FIG. 10. The audio module 1180 may process, for example, sound information that is input or output through a speaker 1182, a receiver 1184, an earphone 1186, or the microphone 1188.

The camera module 1191 may shoot a still image or a video. According to an embodiment of the present disclosure, the camera module 1191 may include at least one or more image sensors (e.g., a front sensor or a rear sensor), a lens, an image signal processor (ISP), or a flash (e.g., an LED or a xenon lamp).

The power management module 1195 may manage, for example, power of the electronic device 1101. According to an embodiment of the present disclosure, a power management integrated circuit (PMIC), a charger IC, or a battery gauge may be included in the power management module 1195. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, or a rectifier, and the like. The battery gauge may measure, for example, a remaining charge capacity of the battery 1196 and a voltage, current or temperature thereof while the battery is charged. The battery 1196 may include, for example, a rechargeable battery and/or a solar battery.

The indicator 1197 may display a specific state of the electronic device 1101 or a part thereof (e.g., the processor 1110), such as a booting state, a message state, a charging state, and the like. The motor 1198 may convert an electrical signal into a mechanical vibration and may generate the following effects: vibration, haptic, and the like. A processing device (e.g., a GPU) for supporting a mobile TV may be included in the electronic device 1101. The processing device for supporting the mobile TV may process media data according to the standards of digital multimedia broadcasting (DMB), digital video broadcasting (DVB), MediaFlo™, and the like.

Each of the above-mentioned elements of the electronic device according to an embodiment of the present disclosure may be configured with one or more components, and the names of the elements may vary according to the type of the electronic device. The electronic device may include at least one of the above-mentioned elements, and some elements may be omitted or other additional elements may be added. Furthermore, some of the elements of the electronic device may be combined with each other so as to form one entity, so that the functions of the elements may be performed in the same manner as before the combination.

Figure 12:
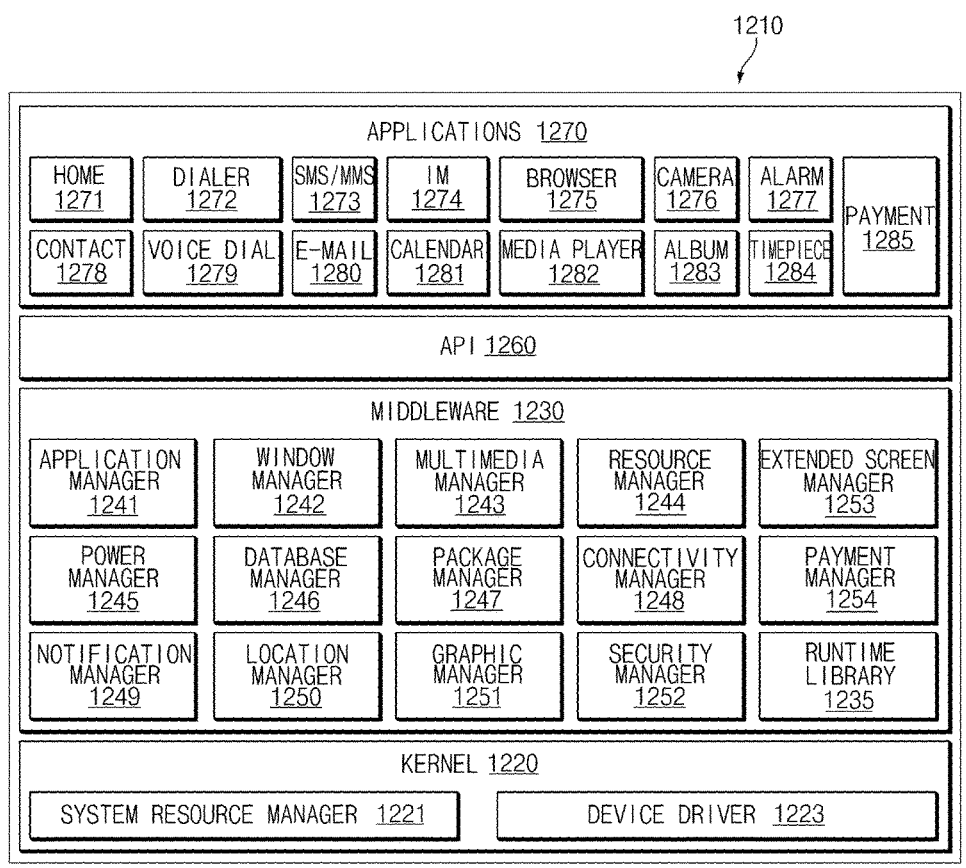
FIG. 12 illustrates a block diagram of a program module, according to an embodiment of the present disclosure.

FIG. 12 illustrates a block diagram of a program module, according to an embodiment of the present disclosure.

According to an embodiment of the present disclosure, a program module 1210 (e.g., the program 1040) may include an operating system (OS) to control resources associated with the electronic device 1001, and/or diverse applications (e.g., the application program 1047) driven on the OS. The OS may be, for example, Android™, iOS™, Windows™, Symbian™, or Tizen™.

The program module 1210 includes a kernel 1220, a middleware 1230, an application programming interface (API) 1260, and/or an application 1270. At least a portion of the program module 1210 may be preloaded on an electronic device or may be downloadable from the first electronic device 1002, the second electronic device 1004, the server 1006, and the like.

The kernel 1220 (e.g., the kernel 1041) includes, for example, a system resource manager 1221 or a device driver 1223. The system resource manager 1221 may perform control, allocation, or retrieval of system resources. According to an embodiment of the present disclosure, the system resource manager 1221 may include a process managing unit, a memory managing unit, or a file system managing unit. The device driver 1223 may include, for example, a display driver, a camera driver, a Bluetooth driver, a shared memory driver, a USB driver, a keypad driver, a Wi-Fi driver, an audio driver, or an inter-process communication (IPC) driver.

The middleware 1230 may provide, for example, a function that the application 1270 needs in common, or may provide diverse functions to the application 1270 through the API 1260 to allow the application 1270 to efficiently use limited system resources of the electronic device. According to an embodiment of the present disclosure, the middleware 1230 (e.g., the middleware 1043) includes at least one of a runtime library 1235, an application manager 1241, a window manager 1242, a multimedia manager 1243, a resource manager 1244, a power manager 1245, a database manager 1246, a package manager 1247, a connectivity manager 1248, a notification manager 1249, a location manager 1250, a graphic manager 1251, a security manager 1252, or a payment manager 1254.

The runtime library 1235 may include, for example, a library module that is used by a compiler to add a new function through a programming language while the application 1270 is being executed. The runtime library 1235 may perform input/output management, memory management, or capacities about arithmetic functions.

The application manager 1241 may manage, for example, a life cycle of at least one application of the application 1270. The window manager 1242 may manage a graphic user interface (GUI) resource that is used in a screen. The multimedia manager 1243 may identify a format necessary for playing diverse media files, and may perform encoding or decoding of media files by using a codec suitable for the format. The resource manager 1244 may manage resources such as a storage space, memory, or source code of at least one application of the application 1270.

For example, the power manager 1245 may operate with a basic input/output system (BIOS) and the like to manage capacity, temperature, or power of a battery, and may determine or provide power information for an operation of an electronic device by using the corresponding information thereof. The database manager 1246 may generate, search for, or modify database that is to be used in at least one application of the application 1270. The package manager 1247 may install or update an application that is distributed in the form of package file.

The connectivity manager 1248 may manage, for example, wireless connection such as Wi-Fi or Bluetooth. The notification manager 1249 may display or notify an event such as arrival message, appointment, or proximity notification in a mode that does not disturb a user. The location manager 1250 may manage location information about an electronic device. The graphic manager 1251 may manage a graphic effect that is provided to a user, or manage a user interface relevant thereto. The security manager 1252 may provide a general security function necessary for system security, user authentication, and the like. According to an embodiment of the present disclosure, in the case where an electronic device 1001 includes a telephony function, the middleware 1230 may further include a telephony manager for managing a voice or video call function of the electronic device.

The middleware 1230 may include a middleware module that combines diverse functions of the above-described elements. The middleware 1230 may provide a module specialized to each OS type to provide differentiated functions. Additionally, the middleware 1230 may dynamically remove a part of the preexisting elements or may add new elements thereto.

The API 1260 may be, for example, a set of programming functions and may be provided with a configuration that is variable depending on an OS. For example, in the case where an OS is Android or iOS™, it may provide one API set per platform. In the case where an OS is Tizen™, it may provide two or more API sets per platform.

The application 1270 includes, for example, one or more applications capable of providing functions for a home 1271, a dialer 1272, an SMS/MMS 1273, an instant message (IM) 1274, a browser 1275, a camera 1276, an alarm 1277, a contact 1278, a voice dial 1279, an e-mail 1280, a calendar 1281, a media player 1282, an album 1283, a timepiece 1284, and a payment 1285 or for offering health care (e.g., measuring an exercise quantity, blood sugar level, and the like) or environment information (e.g., information of barometric pressure, humidity, temperature, and the like).

According to an embodiment of the present disclosure, the application 1270 may include an information exchanging application to support information exchange between the electronic device 1001 and the first electronic device 1002 or the second electronic device 1004. The information exchanging application may include, for example, a notification relay application for transmitting specific information to an external electronic device, or a device management application for managing the external electronic device.

For example, the notification relay application may include a function of transmitting notification information, which arise from other applications (e.g., applications for SMS/MMS, e-mail, health care, or environmental information), to an external electronic device. Additionally, the information exchanging application may receive, for example, notification information from an external electronic device and provide the notification information to a user.

The device management application may manage (e.g., install, delete, or update), for example, at least one function (e.g., turn-on/turn-off of an external electronic device itself (or a part of elements) or adjustment of brightness (or resolution) of a display) of the external electronic device which communicates with the electronic device, an application running in the external electronic device, or a service (e.g., a call service, a message service, and the like) provided from the external electronic device.

According to an embodiment of the present disclosure, the application 1270 may include an application (e.g., a health care application of a mobile medical device) that is assigned in accordance with an attribute of an external electronic device. According to an embodiment, the application 1270 may include an application that is received from the first electronic device 1002, the second electronic device 1004, or the server 1006. The application 1270 may include a preloaded application or a third party application that is downloadable from a server. The names of elements of the program module 1210 may be modifiable depending on kinds of operating systems.

According to an embodiment of the present disclosure, at least a portion of the program module 1210 may be implemented by software, firmware, hardware, or a combination of two or more thereof. At least a portion of the program module 1210 may be implemented (e.g., executed), for example, by the processor 1110. At least a portion of the program module 1210 may include, for example, modules, programs, routines, sets of instructions, processes, and the like for performing one or more functions.

The term "module" as used in the present disclosure may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to an embodiment of the present disclosure may be, for example, implemented by instructions stored in a computer-readable storage media in the form of a program module. The instruction, when executed by a processor 1020, may cause the one or more processors to perform a function corresponding to the instruction. The computer-readable storage media, for example, may be the memory 1030.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, a program instruction may include not only a mechanical code such as generated by a compiler but also a high-level language code executable on a computer using an interpreter. The above hardware unit may be configured to operate via one or more software modules for performing an operation according to an embodiment of the present disclosure, and vice versa.

A module or a program module according to an embodiment of the present disclosure may include at least one of the above elements, or a part of the above elements may be omitted, or additional other elements may be further included. Operations performed by a module, a program module, or other elements may be executed sequentially, in parallel, repeatedly, or in a heuristic method. In addition, some operations may be executed in different sequences or may be omitted. Alternatively, other operations may be added.

According to an embodiment of the present disclosure, abnormal operation of a battery may be tested and detected.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a power interface configured to receive a first current from an external power source;
a battery capable of being charged using the first current;
a system circuit configured to operate using the first current or a second current supplied from the battery;
a resistor capable of being selectively connected to the battery;
a first switch configured to electrically connect or disconnect the battery to or from the external power source;
a second switch configured to electrically connect or disconnect the battery to or from the resistor; and
a power management circuit configured to control an operation of the first switch and the second switch,
wherein the power management circuit is further configured to:
electrically connect the battery with the external power source using the first switch such that a first portion of the first current supplied from the external power source is supplied to the system circuit and a second portion of the first current is supplied to the battery;
if a specified condition is satisfied, electrically disconnect the battery from the external power source using the first switch and electrically connect the battery with the resistor using the second switch;
verify an electrical characteristic of a current applied to the resistor while the battery is electrically disconnected from the external power source and is electrically connected with the resistor; and
determine whether an operation of the battery is abnormal, based at least on a part of the electrical characteristic.

2. The electronic device of claim 1, wherein the power management circuit is further configured to:
determine whether the specified condition is satisfied, based at least on a part of a result of comparing a first amount of the first current supplied from the external power source during a specified time period with a second amount of a current used by the system circuit during the specified time period.

3. The electronic device of claim 2, wherein the power management circuit is further configured to:
determine that the specified condition is satisfied, if the first amount is not less than a specified multiple of the second amount.

4. The electronic device of claim 1, wherein the power management circuit is further configured to:
increase the first current supplied from the external power source, if the specified condition is not satisfied.

5. The electronic device of claim 1, wherein the power management circuit is further configured to:
determine whether the specified condition is satisfied, for each specified period;
use a first specified condition as at least a part of the specified condition at a first time point corresponding to the specified period; and
use a second specified condition as at least a part of the specified condition at a second time point corresponding to the specified period.

6. The electronic device of claim 1, wherein the power management circuit is further configured to:
determine whether the specified condition is satisfied, for each specified period or for each period that is adjusted from the specified period based at least on a part of a usage status of the electronic device.

7. The electronic device of claim 6, further comprising:
a processor,
wherein the processor is configured to:
adjust the specified period and set the specified period.

8. The electronic device of claim 1, wherein the power management circuit is further configured to:
measure a time required for a battery voltage to vary by a specified variation from a point in time when the battery is electrically connected with the resistor; and
determine whether the operation of the battery is abnormal, if the measured time is less than a specified time.

9. The electronic device of claim 1, wherein the power management circuit is further configured to:
electrically connect the battery with the resistor after the battery is electrically disconnected from the external power source and a specified time elapses.

10. The electronic device of claim 1, wherein the power management circuit is further configured to:
electrically connect the battery with the external power source using the first switch and electrically disconnect the battery from the resistor using the second switch, after determining whether the operation of the battery is abnormal.

11. The electronic device of claim 1, further comprising:
a third switch configured to electrically connect or disconnect the battery to or from the system circuit,
wherein the power management circuit is further configured to:
electrically connect the battery with the system circuit using the third switch, if the specified condition is satisfied.

12. The electronic device of claim 11, further comprising:
a diode connected in series with the third switch,
wherein, when the battery is electrically connected with the system circuit using the third switch, the diode passes a current flowing from the battery to the system circuit and blocks a current flowing from the system circuit to the battery.

13. The electronic device of claim 11, wherein the power management circuit is further configured to:
as at least a part of the verifying of the electrical characteristic,
determine whether the external power source is electrically disconnected from the system circuit, based on an amount of the first current if the determined result indicates that the external power source is disconnected from the system circuit,
electrically disconnect the battery from the resistor using the second switch, electrically connect the battery with the external power source using the first switch, and
disconnect the battery from the system circuit using the third switch.

14. A method of controlling an electronic device by at least one processor, the method comprising:
electrically connecting a battery with an external power source using a first switch such that a first portion of a first current supplied from the external power source is supplied to a system circuit of the electronic device and a second portion of the first current is supplied to the battery;
electrically disconnecting the battery from the external power source using the first switch and electrically connecting the battery with a resistor using a second switch, if a specified condition is satisfied;
verifying an electrical characteristic of a current applied to the resistor while the battery is electrically disconnected from the external power source and is electrically connected with the resistor; and
determining whether an operation of the battery is abnormal, based at least on a part of the electrical characteristic.

15. The method of claim 14, further comprising:
comparing a first amount of the first current, which is supplied from the external power source during a specified time period, with a second amount of a current used by the system circuit during the specified time period; and
determining whether the specified condition is satisfied, based at least on a part of a comparison result of the first amount with the second amount.

16. The method of claim 14, further comprising:
increasing the first current supplied from the external power source, if the specified condition is not satisfied.

17. The method of claim 14, further comprising:
determining whether the specified condition is satisfied, for each specified period or for each period that is adjusted from the specified period based at least on a part of a usage status of the electronic device.

18. The method of claim 14, wherein verifying the electrical characteristic includes:
measuring a time required for a battery voltage to vary by a specified variation at a point in time when the resistor is electrically connected with the battery; and
determining whether the operation of the battery is abnormal, if the measured time is less than a critical time.

19. The method of claim 14, further comprising:
electrically connecting the battery with the external power source using the first switch after determining whether the operation of the battery is abnormal; and
electrically disconnecting the battery from the resistor using the second switch.

20. A non-transitory computer-readable recording medium having recorded thereon a program, which when executed, performs a method of controlling an electronic device, the method comprising:
electrically connecting a battery with an external power source using a first switch such that a first portion of a first current supplied from the external power source is supplied to a system circuit of the electronic device and a second portion of the first current is supplied to the battery;
electrically disconnecting the battery from the external power source using the first switch and electrically connecting the battery with a resistor using a second switch, if a specified condition is satisfied;
verifying an electrical characteristic of a current applied to the resistor while the battery is electrically disconnected from the external power source and is electrically connected with the resistor; and
determining whether an operation of the battery is abnormal, based at least on a part of the electrical characteristic.

* * * * *